(12) United States Patent
Lee et al.

(10) Patent No.: US 12,707,793 B2
(45) Date of Patent: Aug. 11, 2026

(54) DISPLAY DEVICE AND METHOD FOR FABRICATING THE SAME

(71) Applicant: Samsung Display Co., LTD., Yongin-si (KR)

(72) Inventors: Seung Geun Lee, Hwaseong-si (KR); Jin Wan Kim, Hwaseong-si (KR); Su Jeong Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 909 days.

(21) Appl. No.: 17/879,274

(22) Filed: Aug. 2, 2022

(65) Prior Publication Data

US 2023/0207607 A1 Jun. 29, 2023

(30) Foreign Application Priority Data

Dec. 29, 2021 (KR) ........................ 10-2021-0191003

(51) Int. Cl.
*H10H 29/14* (2025.01)
*H10H 20/01* (2025.01)
(Continued)

(52) U.S. Cl.
CPC ...... *H10H 29/142* (2025.01); *H10H 20/0137* (2025.01); *H10H 20/825* (2025.01);
(Continued)

(58) Field of Classification Search
CPC ............. H10H 29/142; H10H 20/0137; H10H 20/825; H10H 20/8312; H10H 20/857;
(Continued)

(56) References Cited

U.S. PATENT DOCUMENTS 9,202,982 B2 * 12/2015 Obata .................. H10H 20/831
10,886,327 B2 * 1/2021 Chae ...................... H10H 29/14
(Continued)

FOREIGN PATENT DOCUMENTS

CN 112768580 A * 5/2021 ........... H10H 20/831
KR 10-1875416 7/2018
(Continued)

OTHER PUBLICATIONS

Cheng Zhang et al., "Toward Quantitative Electrochemical Nanomachining of III-Nitrides", Journal of The Electrochemical Society, 165 (10) E513-E520 (2018).
(Continued)

*Primary Examiner* — Monica D Harrison
*Assistant Examiner* — David M Helberg
(74) *Attorney, Agent, or Firm* — CANTOR COLBURN LLP

(57) ABSTRACT

A display device includes: a plurality of pixel electrodes disposed to be spaced apart from each other on a substrate; a plurality of light emitting elements disposed on the plurality of pixel electrodes; a first undoped semiconductor layer on the plurality of light emitting elements; a second undoped semiconductor layer between the first undoped semiconductor layer and the plurality of light emitting elements; and a common electrode layer between the first undoped semiconductor layer and the second undoped semiconductor layer, wherein the common electrode layer includes at least two parts which are separated from each other.

12 Claims, 21 Drawing Sheets

(51) Int. Cl.
*H10H 20/825* (2025.01)
*H10H 20/831* (2025.01)
*H10H 20/857* (2025.01)

(52) U.S. Cl.
CPC ...... *H10H 20/8312* (2025.01); *H10H 20/857* (2025.01); *H10H 20/032* (2025.01)

(58) Field of Classification Search
CPC ............. H10H 20/032; H10H 20/0364; H10H 20/817; H10H 20/831; H10H 20/832; H01L 25/167
See application file for complete search history.

(56) References Cited

U.S. PATENT DOCUMENTS 11,158,610 B2 10/2021 Jeon et al.
11,990,565 B2 * 5/2024 Kim .................... H01L 21/7806
2008/0117947 A1 * 5/2008 Masui ..................... H10F 30/21 372/50.21
2020/0227255 A1 7/2020 Zhu et al.
2020/0328327 A1 10/2020 He et al.
2022/0115564 A1 4/2022 Jeon et al.

FOREIGN PATENT DOCUMENTS

KR 10-2018-0089771 8/2018
KR 10-2018-0118488 10/2018
KR 20180125192 A * 11/2018 ............. H01L 33/22
KR 10-1968592 4/2019
KR 10-2020-0016127 2/2020
KR 10-2022-0049065 4/2022
TW 1736455 B * 8/2021 ........... H10H 20/831

OTHER PUBLICATIONS

Shubhra S. Pasayat et al., "Demonstration of ultra-small (<10 μm) 632 nm red InGaN micro-LEDs with useful on-wafer external quantum effiicencey (>0.2%) for mini-displays", Applied Physics Express 14, 011004 (2021).

* cited by examiner

FIG. 5

200
100
FL
INS
CNE1
500
AE
PXC
110
I'
LE3
LE2
LE1
DA
CNE3
CEP
CNE2
CPA1
NDA
700
PDC
PD
I
DR3
LE: LE1, LE2, LE3

DISPLAY DEVICE AND METHOD FOR FABRICATING THE SAME

CROSS-REFERENCE TO RELATED APPLICATION(S)

This application claims priority to and benefits of Korean Patent Application No. 10-2021-0191003 under 35 U.S.C. 119, filed on Dec. 29, 2021 in the Korean Intellectual Property Office (KIPO), the entire contents of which are incorporated herein by reference.

BACKGROUND

1. Technical Field

Embodiments of the disclosure relates to a display device.

2. Description of the Related Art

As the information society develops, the demand for display devices for displaying images has increased and diversified. The display devices may include flat panel display devices such as liquid crystal displays (LCDs), field emission displays (FEDs), or light emitting displays (LEDs). Light emitting display devices may include an organic light emitting display device including an organic light emitting diode element, an inorganic light emitting display device including an inorganic semiconductor light emitting element, and a micro light emitting display device including a micro light emitting diode element.

Recently, head mounted displays (HMDs) including the light emitting display devices have been developed. The head mounted display (HMD) is a glasses-type monitor device for virtual reality (VR) or augmented reality (AR) that is implemented in the form of glasses or a helmet to control a focus at a distance close to user's eyes in front of the user's eyes. A high-resolution micro light emitting diode display panel including a micro light emitting diode element may be applied to the head mounted display.

SUMMARY

Embodiments of the disclosure provide a display device capable of minimizing or preventing a defect in case that a light emitting element for emitting light of a long wavelength band is formed or grown.

Embodiments of the disclosure also provide a method for fabrication of a display device capable of minimizing or preventing a defect in case that a light emitting element for emitting light of a long wavelength band is formed or grown.

However, embodiments of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device comprises a plurality of pixel electrodes spaced apart from each other on a substrate; a plurality of light emitting elements disposed on the plurality of pixel electrodes; a first undoped semiconductor layer on the plurality of light emitting elements; a second undoped semiconductor layer between the first undoped semiconductor layer and the plurality of light emitting elements; and a common electrode layer between the first undoped semiconductor layer and the second undoped semiconductor layer, wherein the common electrode layer includes at least two parts which are separated from each other.

The plurality of light emitting elements may include: a first light emitting element; a second light emitting element; and a third light emitting element, the common electrode layer may include: a first common electrode part on the first light emitting element; and a second common electrode part on the second light emitting element and the third light emitting element, and the first common electrode part and the second common electrode part may be spaced apart from each other.

The second common electrode part on the second light emitting element and the second common electrode part on the third light emitting element may be integral with each other.

The second undoped semiconductor layer may include: a first undoped semiconductor part on the first light emitting element; and a second undoped semiconductor part on the second light emitting element and the third light emitting element, and the first undoped semiconductor part and the second undoped semiconductor part may be spaced apart from each other.

The second undoped semiconductor part on the second light emitting element and the second undoped semiconductor part on the third light emitting element may be integral with each other.

The first undoped semiconductor layer on the first light emitting element, the second light emitting element, and the third light emitting element may be integral with each other.

The first common electrode part may include a porous semiconductor layer.

The porous semiconductor layer may include porous gallium nitride (GaN).

A porous density of the first common electrode part may be greater than a porous density of the second common electrode part.

The plurality of light emitting elements may include: a first light emitting element; a second light emitting element; and a third light emitting element, the common electrode layer may include: a first common electrode part on the first light emitting element; a second common electrode part on the second light emitting element; and a third common electrode part on the third light emitting element, and the first common electrode part, the second common electrode part, and the third common electrode part may be spaced apart from each other.

The second undoped semiconductor layer may include: a first undoped semiconductor part on the first light emitting element; a second undoped semiconductor part on the second light emitting element; and a third undoped semiconductor part on the third light emitting element, and the first undoped semiconductor part, the second undoped semiconductor part, and the third undoped semiconductor part may be spaced apart from each other.

The first undoped semiconductor layer on the first light emitting element, the second light emitting element, and the third light emitting element may be integral with each other.

Each of the first common electrode part and the second common electrode part may include a porous semiconductor layer.

The porous semiconductor layer may include porous gallium nitride (GaN).

A porous density of the first common electrode part may be greater than a porous density of the second common electrode part.

According to another embodiment, a method for fabrication of a display device, comprises forming a first undoped semiconductor layer on a substrate; forming a common electrode layer including an n-type semiconductor on the first undoped semiconductor layer; forming a second undoped semiconductor layer on the common electrode layer; forming a first light emitting element on the second undoped semiconductor layer; forming a second light emitting element on the second undoped semiconductor layer; forming a first common electrode part in an area for forming a third light emitting element and a second common electrode part on the first and second light emitting elements by selectively removing the second undoped semiconductor layer and the common electrode layer; forming the first common electrode part in a porous structure; and forming the third light emitting element on the second undoped semiconductor layer.

The forming of the first common electrode part in the porous structure may be performed by an electro-chemical (EC) etching process.

The first common electrode part may include a porous semiconductor layer, and the porous semiconductor layer may include porous gallium nitride (GaN).

A porous density of the first common electrode part may be greater than a porous density of the second common electrode part.

The first light emitting element may include a blue light emitting element, the second light emitting element includes a green light emitting element, and the third light emitting element includes a red light emitting element.

With the display device and the method for fabrication thereof according to embodiments, a defect may be minimized or prevented in case that a light emitting element for emitting light of a long wavelength band is formed or grown.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings.

FIG. 5 is a schematic cross-sectional view taken along line I-I' of FIG. 2.

DETAILED DESCRIPTION OF THE EMBODIMENTS

Figure 1:
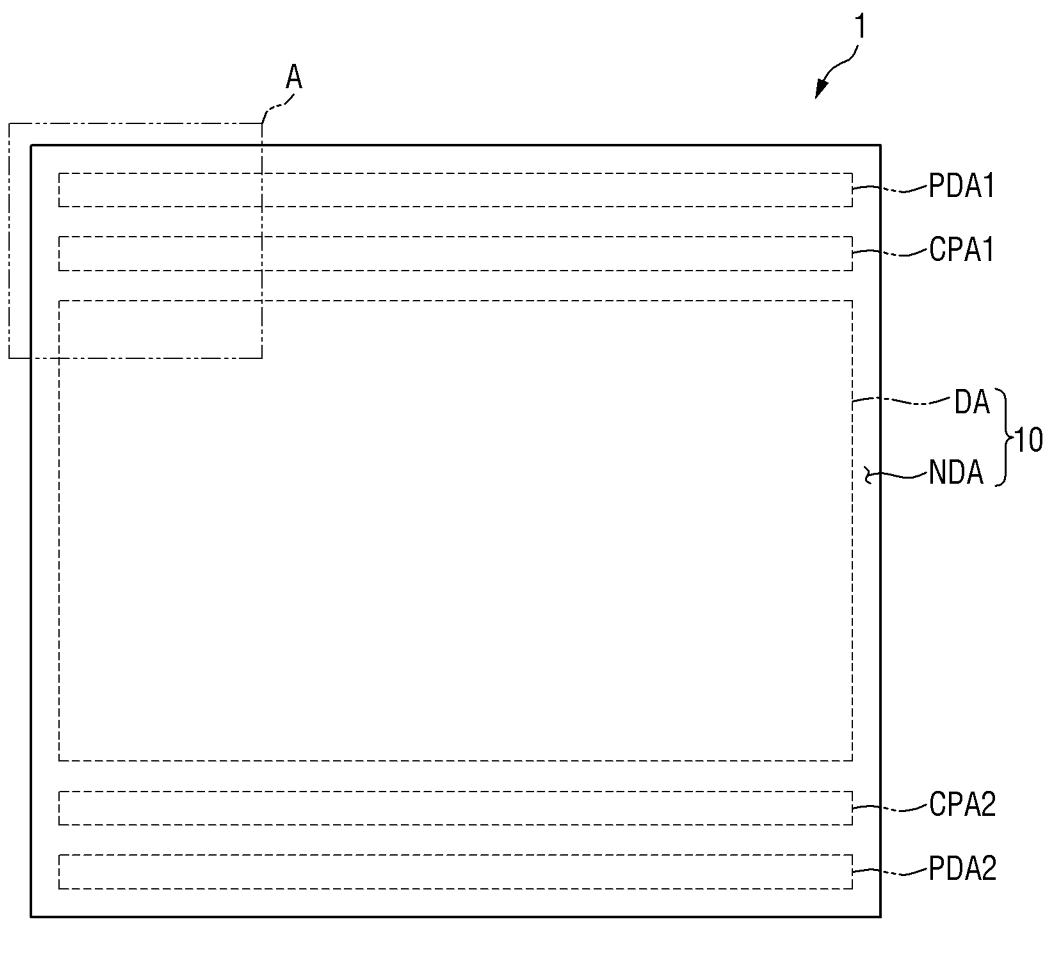
FIG. 1 is a schematic plan view of a display device according to an embodiment.
Figure 1:
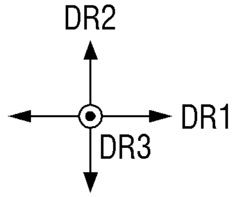

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
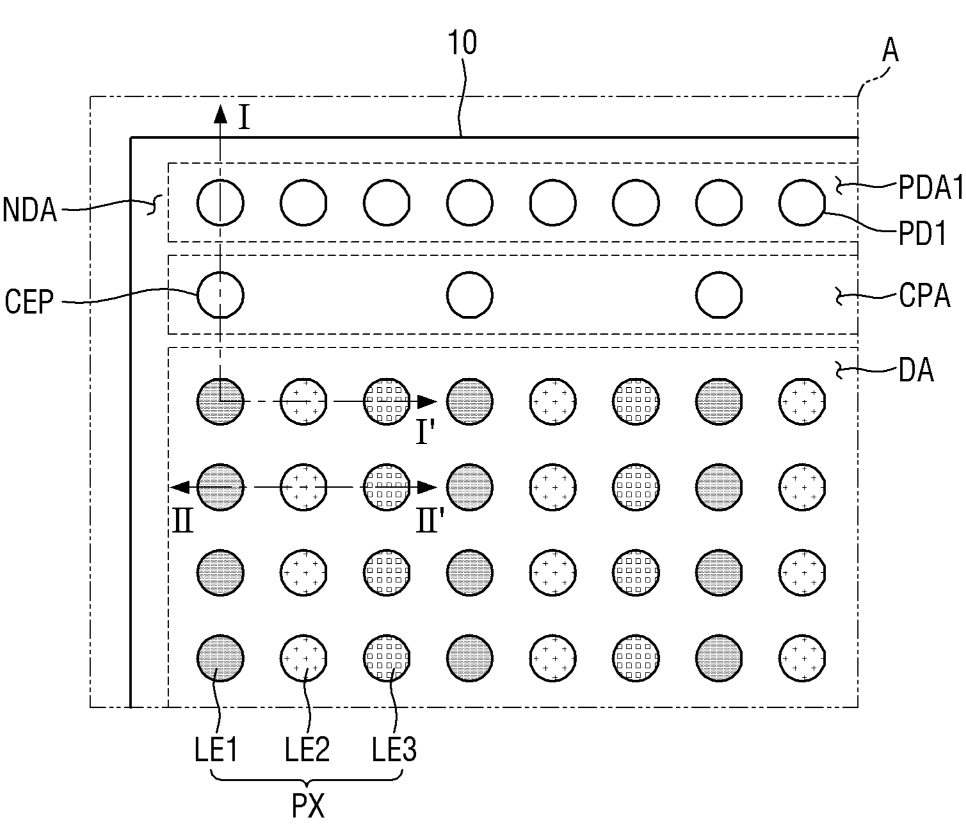
FIG. 2 is a schematic enlarged plan view illustrating an example of area A of FIG. 1.
Figure 2:
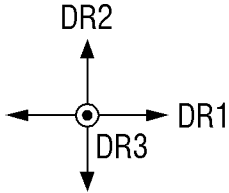

FIG. 1 is a schematic plan view of a display device according to an embodiment, and FIG. 2 is a schematic enlarged plan view illustrating an example of area A of FIG. 1.

It will be described in FIGS. 1 to 2 that a display device 1 according to an embodiment is a micro light emitting diode display device (or a nano light emitting diode display device) including a micro light emitting diode (or a nano light emitting diode) as a light emitting element LE, but embodiments are not limited thereto.

For example, in FIGS. 1 and 2, a first direction DR1 refers to a transverse direction of a display panel 10, a second direction DR2 refers to a longitudinal direction of the display panel 10, and a third direction DR3 refers to a thickness direction of the display panel 10 or a thickness direction of a semiconductor circuit substrate 100. Further, the third direction DR3 refers to a vertical direction perpendicular to the first direction DR1 and/or the second direction DR2. In this case, "left", "right", "upper", and "lower" refer to directions when the display panel 10 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2. For example, "upper portion" refers to one side in the third direction DR3, and "lower portion" refers to the other side in the third direction DR3.

Referring to FIGS. 1 and 2, the display device according to an embodiment may include a display panel 10 including a display area DA and non-display areas NDA.

The display panel 10 may have a rectangular shape, in a plan view, having long sides in the first direction DR1 and short sides in the second direction DR2. However, the shape of the display panel 10 in a plan view is not limited thereto, and the display panel 10 may have a polygonal, circular, elliptical, or irregular shape in a plan view other than the rectangular shape.

The display area DA may be an area in which an image is displayed, and the non-display areas NDA may be areas in which an image is not displayed. The non-display areas NDA may partially or entirely surround the periphery of the display area DA. The non-display areas NDA may constitute a bezel of the display panel 10. Lines or circuit drivers included in the display panel 10 may be disposed in the non-display areas NDA and/or external devices may be mounted in the non-display areas NDA.

The display area DA of the display panel 10 may include pixels PX. Each of the pixels PX may include light emitting elements LE. Each of the pixels PX may include one or more light emitting elements LE to display a specific color. Each of the pixel PX may include light emitting elements LE (e.g., LE1, LE2, LE3, and LE4), and may be defined as a minimum light emitting unit capable of displaying white light.

For example, a first light emitting element LE1 may emit light of a first color, a second light emitting element LE2 and a fourth light emitting element LE4 may emit light of a second color, and a third light emitting element LE3 may emit light of a third color. As an example, the first color may be red, the second color may be green, and the third color may be blue. For example, a main peak wavelength of the light of the first color may be in the range of about 600 nm to about 750 nm, a main peak wavelength of the light of the second color may be in the range of about 480 nm to about 560 nm, and a main peak wavelength of the light of the third color may be in the range of about 370 nm to about 460 nm, but embodiments are not limited thereto. For example, the respective light emitting elements LE may emit light of the same color, and any one of the respective light emitting elements LE may emit light of a yellow color. A main peak wavelength of yellow light may be in the range of about 550 nm to about 600 nm. In an embodiment, at least one pixel PX may include four light emitting elements LE1, LE2, LE3, and LE4, but embodiments are not limited thereto.

Each of the light emitting elements LE may have a circular shape in a plan view. However, embodiments are not limited thereto, and the light emitting element LE may have a polygonal shape such as a quadrangular shape or a pentagonal shape, an elliptical shape, or an irregular shape other than the circular shape.

The light emitting elements LE1, LE2, LE3, and LE4 may be spaced apart from each other in the first direction DR1 and the second direction DR2. The first light emitting elements LE1 and the third light emitting elements LE3 may be alternately arranged in the first direction DR1 and the second direction DR2. The second light emitting elements LE2 and the fourth light emitting elements LE4 may be alternately arranged in the first direction DR1 and the second direction DR2.

The light emitting elements LE1, LE2, LE3, and LE4 may be alternately disposed in diagonal directions DD1 and DD2 between the first direction DR1 and the second direction DR2. The first diagonal direction DD1 may be a direction inclined at 45° with respect to the first direction DR1 and the second direction DR2, and the second diagonal direction DD2 may be a direction orthogonal to the first diagonal direction DD1.

For example, the first light emitting elements LE1 and the second light emitting elements LE2 may be alternately arranged in the first diagonal direction DD1. The third light emitting elements LE3 and the fourth light emitting elements LE4 may be alternately arranged in the first diagonal direction DD1. The first light emitting elements LE1 and the fourth light emitting elements LE4 may be alternately arranged in the second diagonal direction DD2.

An area of the first light emitting element LE1, an area of the second light emitting element LE2, an area of the third light emitting element LE3, and an area of the fourth light emitting element LE4 may be substantially the same as each other, but embodiments are not limited thereto. For example, the area of the first light emitting element LE1 may be greater than those of the second light emitting element LE2, the third light emitting element LE3, and the fourth light emitting element LE4.

Each of the light emitting elements LE may be electrically connected to a pixel electrode AE (see FIG. 5) of a semiconductor circuit substrate 100 (see FIG. 5) through a first connection electrode CNE1 (see FIG. 5) to be described below. For example, each of the light emitting elements LE may be electrically connected to a common electrode layer CEL (see FIG. 6) of a display substrate 200 (see FIG. 5).

Figure 5:
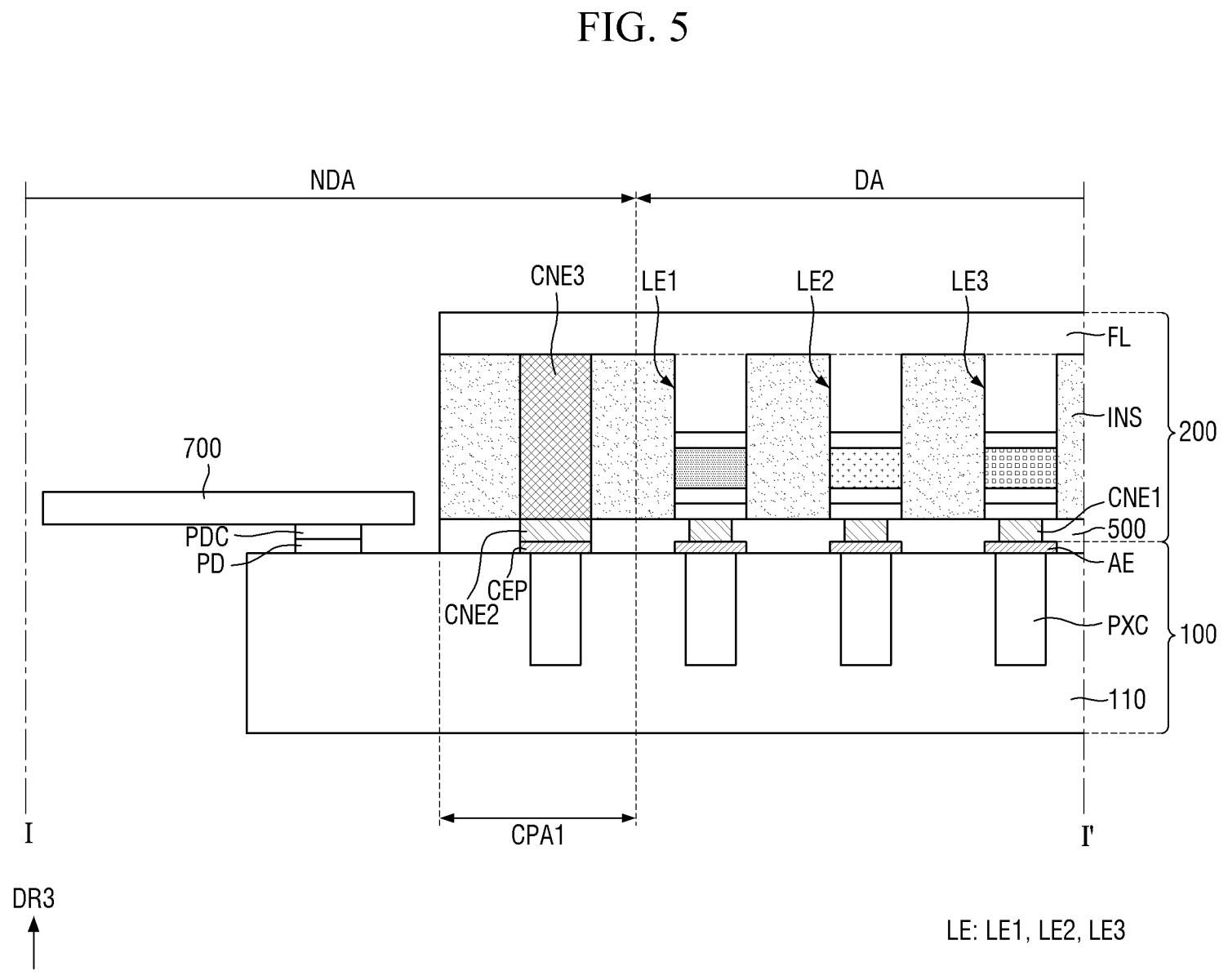

The light emitting elements LE may be defined (e.g., partitioned) by a light emitting defining film INS (see FIG. 5). The light emitting elements LE may have emission areas defined by the light emitting defining film INS. The light emitting defining film INS may partially or entirely surround each of the light emitting elements LE, and may be in direct contact with side surfaces of each of the light emitting elements LE. Accordingly, the light emitting elements LE may not be exposed to external foreign materials such as dust or air in processes for fabrication of the display device. For example, each of the light emitting elements LE may be defined (e.g., partitioned) by the light emitting defining film INS, and thus, the light emitting element LE may be individualized without performing a process of etching the light emitting element LE. This will be described in detail with reference to other drawings.

The non-display area NDA of the display panel 10 may include a first common electrode area CPA1, a second common electrode area CPA2, a first pad area PDA1, and a second pad area PDA2.

The first common electrode area CPA1 may be disposed between the first pad area PDA1 and the display area DA. The second common electrode area CPA2 may be disposed between the second pad area PDA2 and the display area DA. Each of the first common electrode area CPA1 and the second common electrode area CPA2 may include common electrode connection parts CEP. The common electrode connection parts CEP may be spaced apart from each other in the first direction DR1 within the first and second common electrode areas CPA1 and CPA2, but embodiments are not limited thereto.

The common electrode connection parts CEP may be disposed on the semiconductor circuit substrate 100 and receive a common voltage from pixel circuit units PXC. As described below, the first and second common electrode areas CPA1 and CPA2 may include third connection electrodes CNE3 in direct contact with the common electrode connection parts CEP. The third connection electrodes CNE3 may overlap (or face) the respective common electrode connection parts CEP. The third connection electrodes CNE3 may be electrically connected to the common electrode connection parts CEP and the common electrode layer CEL.

The first pad area PDA1 may be disposed on the upper side of the display panel 10. The first pad area PDA1 may include first pads PD1 connected to (e.g., electrically connected to) a circuit board 700 (see FIG. 5). The second pad area PDA2 may be disposed on the lower side of the display panel 10. The second pad area PDA2 may include second pads to be connected to (e.g., electrically connected to) the circuit board 700. In some embodiments, the second pad area PDA2 may be omitted.

The first pads PD1 may be electrically connected to the circuit board 700. The first pads PD1 may be arranged to be spaced apart from each other in the first direction DR1 within the first pad area PDA1. An arrangement of the first pad PD1 may be designed according to the number of light emitting elements LE disposed in the display area DA and an arrangement of lines electrically connected to the light emitting elements LE. An arrangement of different pads may be variously modified according to an arrangement of the light emitting elements LE and the arrangement of the lines electrically connected to the light emitting elements LE.

Figure 3:
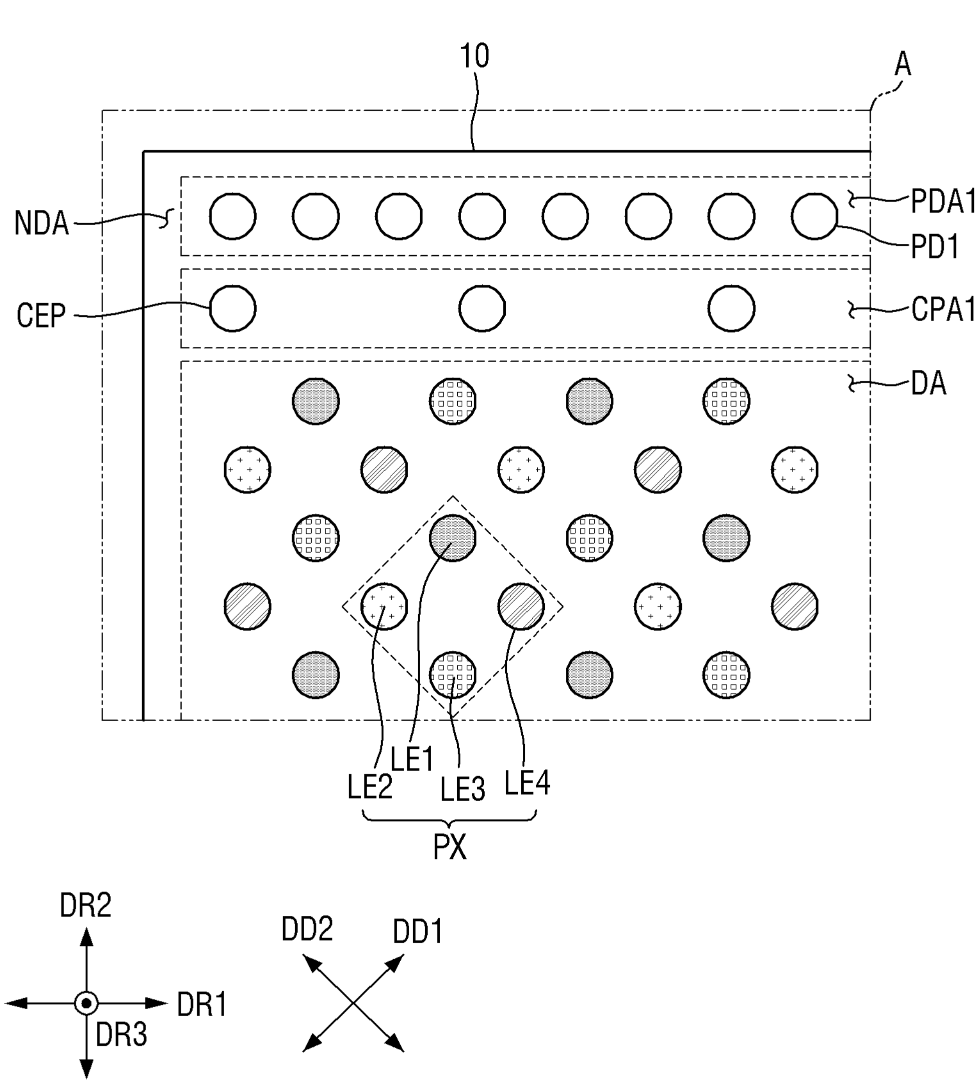
FIG. 3 is a schematic enlarged plan view illustrating another example of area A of FIG. 1.

FIG. 3 is a schematic enlarged plan view illustrating another example of area A of FIG. 1.

In FIG. 3, at least one pixel PX may include three light emitting elements including a first light emitting element LE1, a second light emitting element LE2, and a third light emitting element LE3. The pixels PX may be arranged in a matrix direction, similar to the light emitting elements LE.

For example, at least one pixel PX may include a first light emitting element LE1, a second light emitting element LE2, and a third light emitting element LE3. The first light emitting element LE1 may emit light of a first color, the second light emitting element LE2 may emit light of a second color, and the third light emitting element LE3 may emit light of a third color. As an example, the first color may be red, the second color may be green, and the third color may be blue. However, embodiments are not limited thereto, and the respective light emitting elements LE may emit light of the same color. In an embodiment, at least one pixel PX may include three light emitting elements LE1, LE2, and LE3, but embodiments are not limited thereto.

Each of the light emitting elements LE may have a circular shape in a plan view. However, embodiments are not limited thereto, and the light emitting element LE may have a polygonal shape such as a quadrangular shape or a pentagonal shape, an elliptical shape, or an irregular shape other than the circular shape.

The light emitting elements LE1, LE2, and LE3 may be disposed to be spaced apart from each other in the first direction DR1 and the second direction DR2. The first light emitting elements LE1, the second light emitting elements LE2, and the third light emitting elements LE3 may be alternately arranged in the first direction DR1, and each of the first light emitting elements LE1, the second light emitting elements LE2, and the third light emitting elements LE3 may be repeatedly disposed in the second direction DR2. The first light emitting elements LE1, the second light emitting elements LE2, and the third light emitting elements LE3 may be sequentially disposed in the first direction DR1, and such an arrangement may be repeated.

An area of the first light emitting element LE1, an area of the second light emitting element LE2, and an area of the third light emitting element LE3 may be substantially the same as each other, but embodiments are not limited thereto. For example, the area of the first light emitting element LE1 may be greater than those of the second light emitting element LE2 and the third light emitting element LE3.

Figure 4:
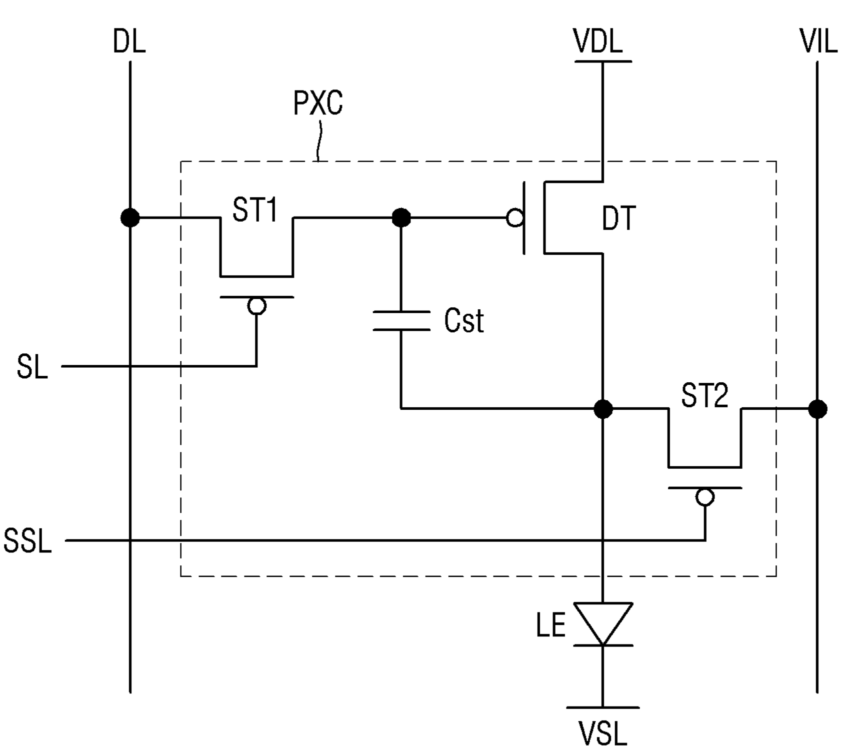
FIG. 4 is an equivalent circuit diagram of a pixel circuit unit and a light emitting element according to an embodiment.

FIG. 4 is an equivalent circuit diagram of a pixel circuit unit and a light emitting element according to an embodiment.

Referring to FIG. 4, each of the pixels PX may include a light emitting element LE and a pixel circuit unit PXC controlling an amount of light emitted from the light emitting element LE.

The light emitting element LE may emit light according to a driving current Ids. An amount of light emitted from the light emitting element LE may be proportional to the driving current Ids. The light emitting element LE may be an inorganic light emitting element including an anode electrode, a cathode electrode, and an inorganic semiconductor disposed between the anode electrode and the cathode electrode. For example, the light emitting element LE may be a micro light emitting diode.

The anode electrode of the light emitting element LE may be connected to (e.g., electrically connected to) a source electrode of a driving transistor DT, and the cathode electrode of the light emitting element LE may be connected to (e.g., electrically connected to) a second power line VSL to which a low potential voltage lower than a high potential voltage is supplied. In the equivalent circuit diagram of FIG. 4, a case where the anode electrode of the light emitting element LE is a pixel electrode ('AE' in FIG. 5) and the cathode electrode of the light emitting element LE is a common electrode connection part CEP (see FIG. 5) is illustrated.

The driving transistor DT may adjust a current flowing from a first power line VDL to which a first source voltage is supplied to the light emitting element LE according to a voltage difference between a gate electrode and the source electrode thereof. The gate electrode of the driving transistor DT may be connected to (e.g., electrically connected to) a first electrode of a first transistor ST1, the source electrode of the driving transistor DT may be connected to (e.g., electrically connected to) the anode electrode of the light emitting element LE, and a drain electrode of the driving transistor DT may be connected to (e.g., electrically connected to) the first power line VDL to which a high potential voltage is applied.

The first transistor ST1 may be turned on by a scan signal of a scan line SL to connect a data line DL to the gate electrode of the driving transistor DT. A gate electrode of the first transistor ST1 may be connected to (e.g., electrically connected to) the scan line SL, the first electrode of the first transistor ST1 may be connected to (e.g., electrically connected to) the gate electrode of the driving transistor DT, and a second electrode of the first transistor ST1 may be connected to (e.g., electrically connected to) the data line DL.

A second transistor ST2 may be turned on by a sensing signal of a sensing signal line SSL to connect an initialization voltage line VIL to the source electrode of the driving transistor DT. A gate electrode of the second transistor ST2 may be connected to (e.g., electrically connected to) the sensing signal line SSL, a first electrode of the second transistor ST2 may be connected to (e.g., electrically connected to) the initialization voltage line VIL, and a second electrode of the second transistor ST2 may be connected to (e.g., electrically connected to) the source electrode of the driving transistor DT.

For example, the first electrode of each of the first and second transistors ST1 and ST2 may be a source electrode, and the second electrode of each of the first and second transistors ST1 and ST2 may be a drain electrode. However, embodiments are not limited thereto. For example, the first electrode of each of the first and second transistors ST1 and ST2 may be a drain electrode, and the second electrode of each of the first and second transistors ST1 and ST2 may be a source electrode.

A capacitor Cst may be formed between the gate electrode and the source electrode of the driving transistor DT. The capacitor Cst may store a voltage difference between a gate voltage and a source voltage of the driving transistor DT.

However, this is only an example, and the pixel circuit unit PXC may have a structure in which it further includes transistors.

For example, it has been illustrated in FIG. 4 that the driving transistor DT and the first and second transistors ST1 and ST2 are n-channel metal oxide semiconductor (NMOS) transistors, but some or all of the driving transistor DT and the first and second transistors ST1 and ST2 may also be implemented as p-channel metal oxide semiconductor (PMOS) transistors.

Figure 6:
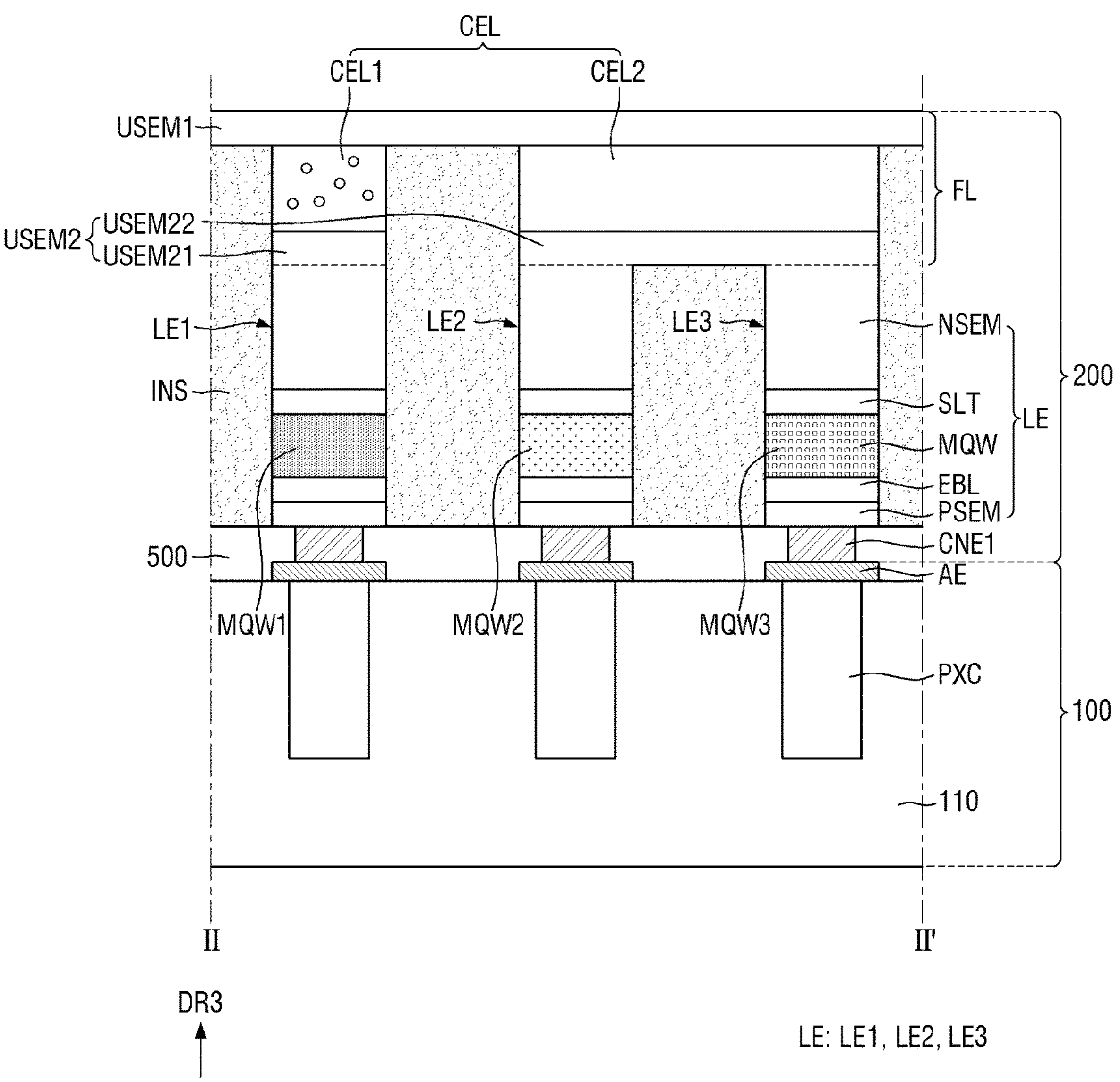
FIG. 6 is a schematic cross-sectional view taken along line II-II' of FIG. 2.

FIG. 5 is a schematic cross-sectional view taken along line I-I' of FIG. 2, and FIG. 6 is a schematic cross-sectional view taken along line II-II' of FIG. 2. FIG. 5 illustrates a cross-section crossing the light emitting elements LE and common electrode connection parts CEP disposed in the non-display area NDA and the display area DA.

Referring to FIGS. 5 and 6, the display device 1 according to an embodiment may include a semiconductor circuit substrate 100 and a display substrate 200.

The semiconductor circuit substrate 100 may include a first substrate 110, pixel circuit units PXC, pixel electrodes AE, and common electrode connection parts CEP. The display substrate 200 may include the light emitting elements LE, a light emitting defining film INS, a common electrode layer CEL, and connection electrodes CNE1, CNE2, and CNE3. The display device 1 may further include a filling layer 500, which is disposed between the semiconductor circuit substrate 100 and the display substrate 200, and a circuit board 700 disposed on the non-display area NDA.

The first substrate 110 may be a silicon wafer substrate. The first substrate 110 may be made of single crystal silicon.

Each of the pixel circuit units PXC may be disposed on the first substrate 110. Each of the pixel circuit units PXC may include a complementary metal oxide semiconductor (CMOS) circuit formed by a semiconductor process. Each of the pixel circuit units PXC may include at least one transistor formed by a semiconductor process. For example, each of the pixel circuit units PXC may further include at least one capacitor formed by a semiconductor process.

The pixel circuit units PXC may be disposed in the display area DA and the non-display area NDA. Pixel circuit units PXC disposed in the display area DA among the pixel circuit units PXC may be electrically connected to corresponding pixel electrodes AE, respectively. For example, the pixel circuit units PXC and pixel electrodes AE may be connected to (e.g., electrically connected to) each other so as to correspond to each other in a one-to-one manner. Each of the pixel circuit units PXC may apply an anode voltage to the pixel electrode AE.

Pixel circuit units PXC disposed in the non-display area NDA among the pixel circuit units PXC may be electrically connected to corresponding common electrode connection parts CEP, respectively. Each of the pixel circuit units PXC may apply a cathode voltage from the second power line VSL (see FIG. 4) to the common electrode connection part CEP. The pixel circuit units PXC may overlap (or face) the common electrode connection parts CEP, second connection electrodes CNE2, and third connection electrodes CNE3 in the third direction DR3.

The pixel electrodes AE may be disposed in the display area DA, and may be disposed on the corresponding pixel circuit units PXC, respectively. Each of the pixel electrodes AE may be an exposed electrode exposed from the pixel circuit unit PXC. For example, each of the pixel electrodes AE and the pixel circuit unit PXC may be integral with each other. For example, each of the pixel electrodes AE may protrude from an upper surface of the pixel circuit unit PXC. Each of the pixel electrodes AE may receive the anode voltage from the pixel circuit unit PXC. The pixel electrode AE may include a metal material such as aluminum (Al), but a type of the pixel electrode AE is not limited thereto.

Common electrode connection parts CEP may be disposed in the first and second common electrode areas CPA1 and CPA2 of the non-display area NDA, and may be disposed on the corresponding pixel circuit units PXC, respectively. The common electrode connection part CEP may be an exposed electrode exposed from the pixel circuit unit PXC. For example, the common electrode connection part CEP and the pixel circuit unit PXC may be integral with each other. For example, each of the common electrode connection parts CEP may protrude from an upper surface of the pixel circuit unit PXC. The common electrode connection part CEP may include a metal material such as aluminum (Al), but a type of the common electrode connection part CEP is not limited thereto.

The common electrode connection parts CEP may electrically connect the second power lines VSL of the pixel circuit units PXC to the third connection electrodes CNE3, the second connection electrodes CNE2, and the common electrode layer CEL of the display substrate 200. Accordingly, a voltage applied to the common electrode layer CEL through the common electrode connection part CEP may be applied to the light emitting element LE.

First pads PD1 may be disposed in the first pad area PDA1 in the non-display area NDA. The first pads PD1 may be disposed to be spaced apart from the common electrode connection parts CEP. The first pads PD1 may be spaced apart from the common electrode connection parts CEP outwardly of the non-display area NDA.

Pad connection electrodes PDC may be disposed on the first pads PD1. The pad connection electrodes PDC may be in contact with upper surfaces of the first pads PD1. For example, the pad connection electrodes PDC and the third connection electrode CNE3 may include a same material. In some embodiments, the pad connection electrodes PDC may be connected to (e.g., electrically connected to) circuit pads CPD1 of the circuit board 700 through conductive connection members such as wires. For example, the first pads PD1, the pad connection electrodes PDC, the wires, and the circuit pads CPD1 of the circuit board 700 may be electrically connected to each other.

For example, the semiconductor circuit substrate 100 and the circuit board 700 may be disposed on a lower substrate. The semiconductor circuit substrate 100 and the circuit board 700 may be attached to an upper surface of the lower substrate by using an adhesive member such as a pressure sensitive adhesive.

The circuit board 700 may be a flexible film such as a flexible printed circuit board (FPCB), a printed circuit board (PCB), a flexible printed circuit (FPC), or a chip on film (COF).

The display substrate 200 may include the light emitting elements LE, the light emitting defining film INS defining the light emitting elements LE, and the common electrode layer CEL, and may be disposed on the semiconductor circuit substrate 100. The light emitting elements LE may be disposed to correspond to the pixel electrodes AE of the semiconductor circuit substrate 100.

The light emitting defining film INS (as a bank layer or a pixel defining film) may be disposed between the pixel electrodes AE of the semiconductor circuit substrate 100 and the common electrode layer CEL. The light emitting defining film INS may not overlap (or may not face) the pixel electrodes AE, may overlap (or face) the common electrode layer CEL, and may be in direct contact with a lower surface of the common electrode layer CEL.

The light emitting defining film INS may protect the light emitting elements LE from external foreign materials such as dust, moisture, or air, and may insulate the light emitting elements LE from other layers. The light emitting defining film INS may include an inorganic insulating material such as silicon nitride ($SiN_x$), silicon oxide ($SiO_x$), silicon oxynitride ($SiO_xN_y$), aluminum oxide ($AlO_y$), or aluminum nitride ($AlN_x$).

In case that the light emitting elements are individualized by dry etching, a sidewall effect in which sidewalls of the light emitting elements are chemically or structurally damaged may occur. For example, the sidewall of the light emitting element may be damaged by an etchant in a dry etching process. For example, non-radiative recombination, in which electrons and holes are recombined with each other without generating light, may occur on the sidewall of the light emitting element. Thus, the non-radiative recombination may cause a decrease in internal quantum efficiency (IQE), external quantum efficiency (EQE) and/or deterioration due to heat generation.

The light emitting elements LE may be disposed, respectively, in openings of the light emitting defining film INS. Each of the light emitting elements LE may be an inorganic light emitting diode element. Each of the light emitting elements LE may include semiconductor layers NSEM, PSEM, EBL, and SLT and an active layer MQW. The light emitting elements LE may be electrically connected to the pixel circuit units PXC of the semiconductor circuit substrate 100 to emit light at the active layers MQW.

Each of the light emitting elements LE may have a shape extending in the third direction DR3 (e.g., the thickness direction of the first substrate 110). A length of the light emitting element LE in the third direction DR3 may be greater than a length of the light emitting element LE in a horizontal direction (e.g., the first direction DR1, the second direction DR2, or the diagonal direction DD1 or DD2). As an example, the length of the light emitting element LE in the third direction DR3 may be about 1 μm to about 5 μm. The light emitting element LE may have a cylindrical shape, a disk shape, or a rod shape with a width greater than a height. However, embodiments are not limited thereto, and the light emitting element LE may have a shape such a rod shape, a wire shape, or a tube shape, or a polygonal prismatic shape such as a cubic shape, a rectangular parallelepiped shape, or a hexagonal prismatic shape, or may have various shapes such as a shape in which it extends in one direction and has outer surfaces partially inclined.

According to an embodiment, each of the light emitting elements LE may include a first semiconductor layer PSEM, an electron blocking layer EBL, an active layer MQW, a superlattice layer SLT, and a second semiconductor layer NSEM. The first semiconductor layer PSEM, the electron blocking layer EBL, the active layer MQW, the superlattice layer SLT, and the second semiconductor layer NSEM may be sequentially stacked each other in the third direction DR3.

The first semiconductor layer PSEM may be a p-type semiconductor, and may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with a p-type dopant. The first semiconductor layer PSEM may be doped with a p-type dopant, which may be Mg, Zn, Ca, Ba, or the like. For example, the first semiconductor layer PSEM may be made of p-GaN doped with Mg as a p-type dopant. The first semiconductor layer PSEM may have a thickness in the range of about 30 nm to about 200 nm.

The electron blocking layer EBL may be disposed on the first semiconductor layer PSEM. The electron blocking layer EBL may prevent a phenomenon in which electrons flowing into the active layer MQW are not recombined with holes in the active layer MQW and are injected to other layers. For example, the electron blocking layer EBL may be made of p-AlGaN doped with Mg as a p-type dopant. A thickness of the electron blocking layer EBL may be in the range of about 10 nm to about 50 nm, but embodiments are not limited thereto. In some embodiments, the electron blocking layer EBL may be omitted.

The active layer MQW may be disposed on the electron blocking layer EBL. The active layer MQW may emit light by recombination of electrons and holes according to light emitting signals applied through the first semiconductor layer PSEM and the second semiconductor layer NSEM. The active layer MQW may include a material having a single or multiple quantum well structure. In case that the active layer MQW includes the material having the multiple quantum well structure, the active layer MQW may have a structure in which well layers and barrier layers are alternately stacked each other. For example, the well layer may be made of InGaN, and the barrier layer may be made of GaN or AlGaN, but embodiments are not limited thereto. For example, the active layer MQW may have a structure in which semiconductor materials having large band gap energy and semiconductor materials having small band gap energy are alternately stacked each other, and may include other Group III to Group V semiconductor materials according to a wavelength band of emitted light.

The superlattice layer SLT is disposed on the active layer MQW. The superlattice layer SLT may alleviate stress due to a difference in lattice constant between the second semiconductor layer NSEM and the active layer MQW. For example, the superlattice layer SLT may be made of InGaN or GaN. A thickness of the superlattice layer SLT may be about 50 nm to about 200 nm. However, the superlattice layer SLT may be omitted.

The second semiconductor layer NSEM may be disposed on the superlattice layer SLT. The second semiconductor layer NSEM may be an n-type semiconductor. The second semiconductor layer NSEM may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The second semiconductor layer NSEM may be doped with an n-type dopant, which may be Si, Ge, Sn, or the like. For example, the second semiconductor layer NSEM may be made of n-GaN doped with Si as an n-type dopant. A thickness of the second semiconductor layer NSEM may be in the range of about 500 nm to about 1 μm, but embodiments are not limited thereto.

According to an embodiment, some of the light emitting elements LE of the display device 1 may include different active layers MQW to emit light of different colors. For example, the first light emitting element LE1 may include a first active layer MQW1 to emit red light as light of a first color, the second light emitting element LE2 and the fourth light emitting element LE4 (see FIG. 2) may include a second active layer MQW2 to emit green light as light of a second color, and the third light emitting element LE3 may include a third active layer MQW3 to emit blue light as light of a third color. In each of the first light emitting element LE1, the second light emitting element LE2, the third light emitting element LE3, and the fourth light emitting element LE4, concentrations of doped dopants in the first semiconductor layers PSEM, the electron blocking layers EBL, the active layers MQW, the superlattice layers SLT, and the second semiconductor layers NSEM or values of 'x' and 'y' in the chemical formula of $Al_xGa_yIn_{1-x-y}N$ ($0 \le x \le 1$, $0 \le y \le 1$, and $0 \le x+y \le 1$) may be different from each other. The first to fourth light emitting elements LE1, LE2, LE3, and LE4 may have substantially the same structure and material, but may emit light of different colors due to different component ratios of the semiconductor layers.

For example, in case that the active layers MQW1, MQW2, and MQW3 include InGaN, a color of light emitted from each of the active layers MQW1, MQW2, and MQW3 may be changed according to a content of indium (In) in each of the active layers MQW1, MQW2, and MQW3. For example, as the content of indium (In) increases, a wavelength band of the light emitted by the active layers may move to a red wavelength band, and as the content of indium (In) decreases, a wavelength band of the light emitted by the active layers may move to a blue wavelength band. Therefore, a content of indium (In) in the first active layer MQW1 may be higher than a content of indium (In) in each of the second active layer MQW2 and the third active layer MQW3. For example, a content of indium (In) in the second active layer MQW2 may be higher than a content of indium (In) in the third active layer MQW3. For example, the content of indium (In) in the third active layer MQW3 may be about 15%, the content of indium (In) in the second active layer MQW2 may be about 25%, and the content of indium (In) in the first active layer MQW1 may be about 35% or higher. For example, the light emitting elements LE may emit the light of the different colors by adjusting the contents of indium (In) in the active layers MQW.

For example, as the contents in indium (In) in the active layers MQW1, MQW2, and MQW3 increase, the lattice constants inside the active layers MQW1, MQW2, and MQW3 may increase. In the specification, the lattice constant is a constant for defining an arrangement of atoms constituting crystals of a material (InGaN) of the active layers MQW1, MQW2, and MQW3 and repeatedly arranged with regularity in a three-dimensional space, and may be expressed as edge lengths (e.g., x-axis length: a, y-axis length: b, and z-axis length: c) of a unit cell, which is a minimum repeating unit constituting a lattice. Since the contents of indium (In) decrease in the order of the first active layer MQW1, the second active layer MQW2, and the third active layer MQW3, the lattice constant of the first active layer MQW1 may be the greatest value, the lattice constant of the second active layer MQW2 may be the medium value, and the lattice constant of the third active layer MQW3 may be the smallest value.

The meaning that as the contents in indium (In) in the active layers MQW1, MQW2, and MQW3 increase, the lattice constants inside the active layers MQW1, MQW2, and MQW3 may increase is that a spaced distance between atoms of InGaN inside each of the active layers MQW1, MQW2, and MQW3 is great, and in case that values a and b of the lattice constants in the active layers MQW1, MQW2, and MQW3 grown from the common electrode layer CEL in a z-axis direction (or the thickness direction) are significantly greater than lattice constants a and b constituting a material of the common electrode layer CEL below the active layers MQW1, MQW2, and MQW3, internal defects may occur in the active layers MQW1, MQW2, and MQW3 in a process of growing the active layers MQW1, MQW2, and MQW3. As described above, the lattice constant of the first active layer MQW1 is the greatest value, the lattice constant of the second active layer MQW2 is the medium value, and the lattice constant of the third active layer MQW3 is the smallest value, and thus, a possibility that an internal defect will occur may be high particularly in the first active layer MQW1.

According to the display device according to an embodiment, as described below with reference to FIG. 8, a common electrode layer CEL' is formed on a second substrate 210, and a second undoped semiconductor layer USEM2' having a lattice constant greater than that of the common electrode layer CEL' is formed on the common electrode layer CEL'. For example, the common electrode layer CEL' overlapping (or facing) the first active layer MQW1 of the first light emitting element LE1 may be formed in a porous structure (see a first common electrode part CEL1 of FIG. 14) before forming the first light emitting element LE1 including the first active layer MQW1 having the highest possibility of the occurrence of the internal defect. Thus, the internal defect of the first active layer MQW1, which occurs in a process of growing the first active layer MQW1, may be minimized or prevented. Here, the reason that the internal defect of the first active layer MQW1, which occurs in the process of growing the first active layer MQW1, may be minimized by the second undoped semiconductor layer USEM2' and the first common electrode part CEL1 will be described below. For example, atoms constituting a material of the second undoped semiconductor layer USEM2' and atoms constituting a material of the first common electrode part CEL1 may be bonded to each other in case that the second undoped semiconductor layer USEM2' overlapping (or facing) the first active layer MQW1 is formed on the first common electrode part CEL1 formed in the porous structure. For example, the second undoped semiconductor layer USEM2' and the first common electrode part CEL1 may be coupled to (e.g., electrically coupled to) each other in case that a difference between a lattice constant (here, a or b) of the material of the second undoped semiconductor layer USEM2' and a lattice constant (a or b) of the material of the first common electrode part CEL1 decreases. Since the first common electrode part CEL1 is formed in the porous structure, the first common electrode part CEL1 may have a porous density higher than that of a second common electrode part CEL2 of the same layer, and may thus have a lattice constant greater than that of the second common electrode part CEL2. As a result, a lattice constant of the second undoped semiconductor layer USEM2' on the first common electrode part CEL1 having the greater lattice constant may be greater than a lattice constant of the second undoped semiconductor layer USEM2' on the second common electrode part CEL2. Accordingly, a difference in lattice constant between the first active layer MQW1 and the second undoped semiconductor layer USEM2' overlapping (or facing) the first active layer MQW1 may be significantly decreased in the process of growing the first active layer MQW1, and thus, the internal defect that may occur in the process of growing the first active layer MQW1 may be significantly suppressed or reduced.

The common electrode layer CEL may be an n-type semiconductor. For example, the common electrode layer CEL and the second semiconductor layer NSEM may include a same material. The common electrode layer CEL may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The common electrode layer CEL may be doped with an n-type dopant, which may be Si, Ge, Sn, or the like. For example, the common electrode layer CEL may be made of n-GaN doped with Si as an n-type dopant.

A functional layer FL may be disposed on the light emitting elements LE1, LE2, and LE3. The functional layer FL may include a first undoped semiconductor layer USEM1 on the light emitting elements LE1, LE2, and LE3, a second undoped semiconductor layer USEM2 between the first undoped semiconductor layer USEM1 and the light emitting elements LE1, LE2, and LE3, and the common electrode layer CEL between the first undoped semiconductor layer USEM1 and the second undoped semiconductor layer USEM2.

The common electrode layer CEL may include a first common electrode part CEL1 on the first light emitting element LE1 and a second common electrode part CEL2 on the second light emitting element LE2 and the third light emitting element LE3. The first common electrode part CEL1 and the second common electrode part CEL2 may be separated from each other. For example, the first common electrode part CEL1 and the second common electrode part CEL2 may be spaced apart from each other, e.g., in a horizontal direction.

The second common electrode part CEL2 on the second light emitting element LE2 and the second common electrode part CEL2 on the third light emitting element LE3 may be integral with each other.

The second undoped semiconductor layer USEM2 may include a first undoped semiconductor part USEM21 on the first light emitting element LE1 and a second undoped semiconductor part USEM22 on the second light emitting element LE2 and the third light emitting element LE3.

The first undoped semiconductor part USEM21 and the second undoped semiconductor part USEM22 may be separated from each other. For example, the first undoped semiconductor part USEM21 and the second undoped semiconductor part USEM22 may be spaced apart from each other, e.g., in a horizontal direction.

The second undoped semiconductor part USEM22 on the second light emitting element LE2 and the second undoped semiconductor part USEM22 on the third light emitting element LE3 may be integral with each other.

The first undoped semiconductor layer USEM1 on the first light emitting element LE1, the second light emitting element LE2, and the third light emitting element LE3 may be integral with each other.

The first common electrode part CEL1 may include a porous semiconductor layer. The porous semiconductor layer may include porous gallium nitride (GaN). A porous density of the first common electrode part CEL1 may be greater than a porous density of the second common electrode part CEL2. For example, the lattice constant of the first common electrode part CEL1 may be greater than the lattice constant of the second common electrode part CEL2. For example, the first common electrode part CEL1 and the second common electrode part CEL2 may have different properties (e.g., different porous densities or different lattice constants) from each other.

Connection electrodes CNE (e.g., CNE1, CNE2, and CNE3) may be disposed between the display substrate 200 and the semiconductor circuit substrate 100. The connection electrodes CNE1, CNE2, and CNE3 may include the first, second, and third connection electrodes CNE1, CNE2, and CNE3. The first connection electrodes CNE1 may be disposed between the light emitting elements LE and the pixel electrodes AE. The second connection electrodes CNE2 and the third connection electrodes CNE3 may be disposed between the common electrode layer CEL and the common electrode connection parts CEP.

The first connection electrodes CNE1 may be disposed to correspond to (e.g., to overlap or face) the light emitting elements LE and the pixel electrodes AE in the display area DA. The first connection electrodes CNE1 may be disposed on a surface (e.g., a lower surface) of the first semiconductor layers PSEM of the light emitting elements LE.

The first connection electrodes CNE1 may be directly disposed on the pixel electrodes AE, and may be electrically connected to the pixel electrodes AE to transfer light emitting signals applied to the pixel electrodes AE to the light emitting elements LE. A width of the first connection electrode CNE1 may be smaller than that of the light emitting element LE, but embodiments are not limited thereto. The first connection electrodes CNE1 may function as a bonding metal for bonding the pixel electrodes AE and the light emitting element LE to each other in a fabrication process. The first connection electrodes CNE1 may include a material that may be electrically connected to the pixel electrodes AE and the light emitting elements ED. For example, the first connection electrode CNE1 may include at least one of gold (Au), copper (Cu), aluminum (Al), and tin (Sn) or include transparent conductive oxide such as indium tin oxide (ITO) or indium zinc oxide (IZO). In other embodiments, the first connection electrode CNE1 may include a first layer including any one of gold (Au), copper (Cu), aluminum (Al), and tin (Sn) and a second layer including another of gold (Au), copper (Cu), aluminum (Al), and tin (Sn).

The second connection electrodes CNE2 and the third connection electrodes CNE3 may be disposed to correspond to (e.g., to overlap or face) the common electrode connection parts CEP in the first common electrode area CPA1. The second connection electrodes CNE2 may be disposed on the common electrode connection parts CEP, and the third connection electrodes CNE3 may be disposed between the second connection electrodes CNE2 and the common electrode connection parts CEP.

The second connection electrodes CNE2 may have a shape extending in a direction and may be disposed in the openings of the light emitting defining film INS.

The third connection electrodes CNE3 may be disposed directly on and in contact with the common electrode connection parts CEP. The third connection electrode CNE3 may be electrically connected to the common electrode connection part CEP, and may be electrically connected to any one of the pads through the pixel circuit unit PXC disposed in the non-display area NDA.

The second connection electrode CNE2 and the third connection electrode CNE3 may include a material that may be electrically connected to the common electrode connection part CEP. For example, the second connection electrode CNE2 and the third connection electrode CNE3 may include at least one of gold (Au), copper (Cu), aluminum (Al), and tin (Sn). In other embodiments, the second connection electrode CNE2 and the third connection electrode CNE3 may include a first layer including any one of gold (Au), copper (Cu), aluminum (Al), and tin (Sn) and a second layer including another of gold (Au), copper (Cu), aluminum (Al), and tin (Sn).

The filling layer 500 may be disposed between the semiconductor circuit substrate 100 and the display substrate 200. The filling layer 500 may fill a space formed between the first substrate 110 and the common electrode layer CLE by steps (e.g., height differences) between the pixel electrodes AE and the common electrode connection parts CEP of the semiconductor circuit substrate 100 and the light emitting elements LE of the display substrate 200. For example, the filling layer 500 may fill spaces formed between the pixel electrodes AE neighboring to each other in the horizontal direction (e.g., the first direction DR1, the second direction DR2, or the diagonal direction DD1 or DD2), between the first connection electrodes CNE1 neighboring to each other in the horizontal direction, and between the common electrode connection parts CEP. The filling layer 500 may be an area (e.g., a space) filled with air or be a vacuum area. The filling layer 500 may function to insulate the exposed electrodes from each other. The filling layer 500 is not limited thereto, and may include an inorganic insulating material such as silicon oxide ($SiO_x$), silicon nitride ($SiN_x$), or silicon oxynitride ($SiO_xN_y$), or include an organic insulating material.

Hereinafter, processes for fabrication of the display device 1 will be described with reference to other drawings.

Figure 7:
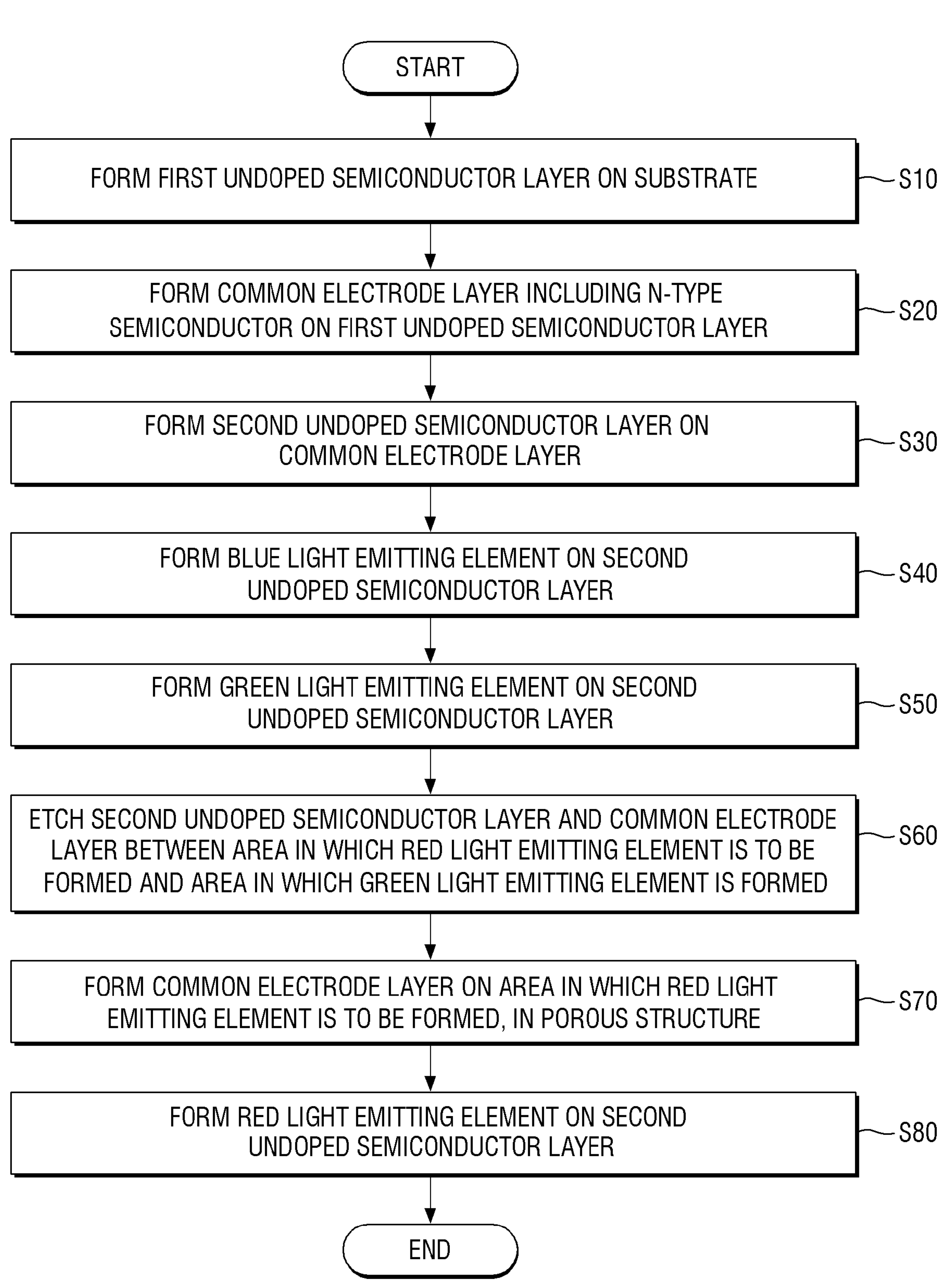
FIG. 7 is a flowchart illustrating a method for fabrication of the display device according to an embodiment.

FIG. 7 is a flowchart illustrating a method for fabrication of the display device according to an embodiment. FIGS. 8 to 16 are schematic cross-sectional views illustrating process steps of the method for fabrication of the display device according to an embodiment.

Referring to FIGS. 1 to 6 and 7, the method for fabrication of the display device 1 according to an embodiment may include forming a first undoped semiconductor layer on a substrate (S10), forming a common electrode layer including an n-type semiconductor on the first undoped semiconductor layer (S20), forming a second undoped semiconductor layer on the common electrode layer (S30), forming a first light emitting element on the second undoped semiconductor layer (S40), forming a second light emitting element on the second undoped semiconductor layer (S50), removing the second undoped semiconductor layer and the common electrode layer between an area in which a third light emitting element is formed and an area in which the second light emitting element is formed to form a first common electrode part on the area in which the third light emitting element is formed and a second common electrode part on the first and second light emitting elements (S60), forming the first common electrode part in a porous structure (S70), and forming the third light emitting element on the second undoped semiconductor layer (S80).

The method for fabrication of the display device 1 may include a process of preparing each of the semiconductor circuit substrate 100 and the display substrate 200 and bonding the semiconductor circuit substrate 100 and the display substrate 200 to each other.

In a process for fabrication of the display substrate 200, a process of preparing a base substrate including undoped semiconductor layers USEM1 and USEM2 and a common electrode layer CEL and forming light emitting elements LE on the base substrate may be performed. The light emitting elements LE may include active layers MQW1, MQW2, and MQW3 having different materials, and may be formed by layers made of different materials according to positions. Hereinafter, a description will be provided with reference to FIGS. 8 to 16, which are cross-sectional views illustrating the respective process steps of the method for fabrication of the display device 1 together with FIG. 7.

Figure 8:
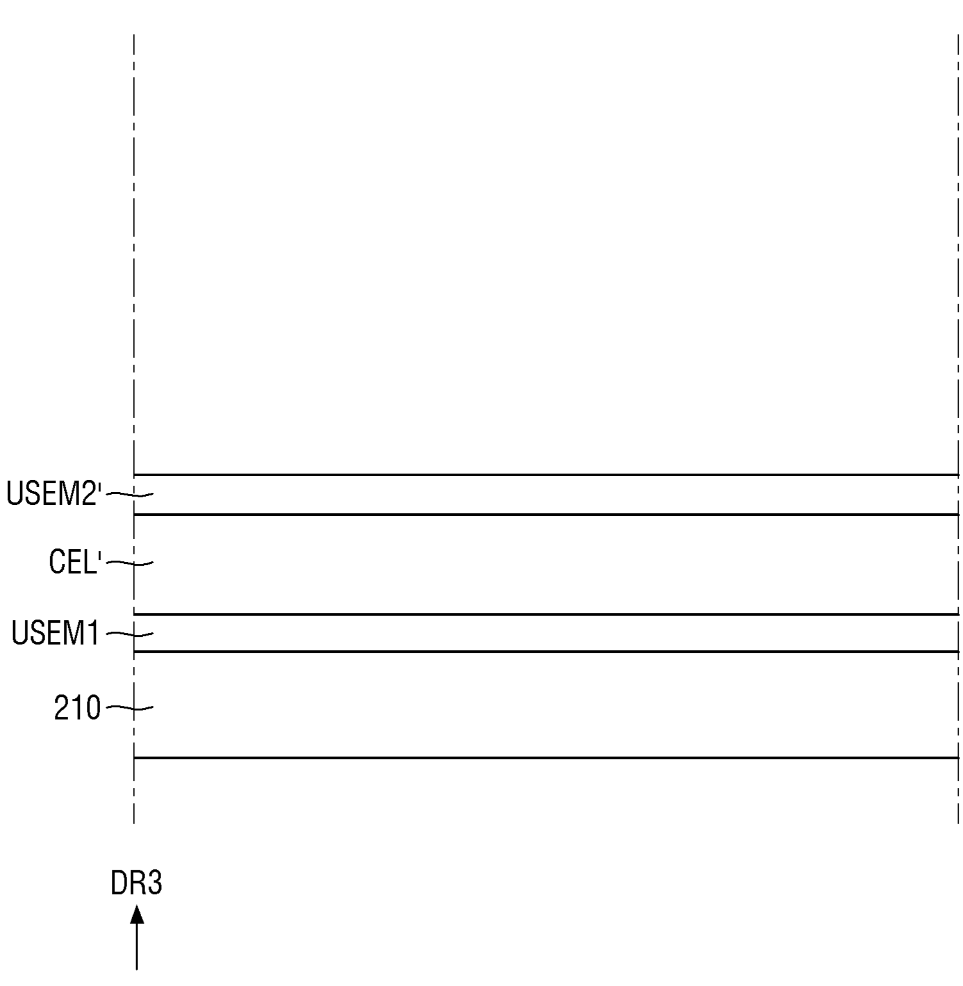
FIGS. 8 to 16 are schematic cross-sectional views illustrating process steps of the method for fabrication of the display device according to an embodiment.

First, referring to FIGS. 7 and 8, the first undoped semiconductor layer USEM1 is formed on the second substrate 210 (S10), the common electrode layer CEL' is formed on the first undoped semiconductor layer USEM1 (S20), and the second undoped semiconductor layer USEM2' is formed on the common electrode layer CEL' (S30). The base substrate includes the first undoped semiconductor layer USEM1, the common electrode layer CEL', and the second undoped semiconductor layer USEM2'.

The undoped semiconductor layers USEM1 and USEM2' and the common electrode layer CEL' may be formed by an epitaxial growth method. The epitaxial growth method may include electron beam deposition, physical vapor deposition (PVD), chemical vapor deposition (CVD), plasma laser deposition (PLD), dual-type thermal evaporation, sputtering, metal organic chemical vapor deposition (MOCVD), or the like. As an example, the undoped semiconductor layers USEM1 and USEM2' and the common electrode layer CEL' may be formed by the metal organic chemical vapor deposition (MOCVD), but embodiments are not limited thereto.

A precursor material for forming semiconductor material layers is not particularly limited within a range that may be usually selected for forming a target material. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but embodiments are not limited thereto.

Figure 9:
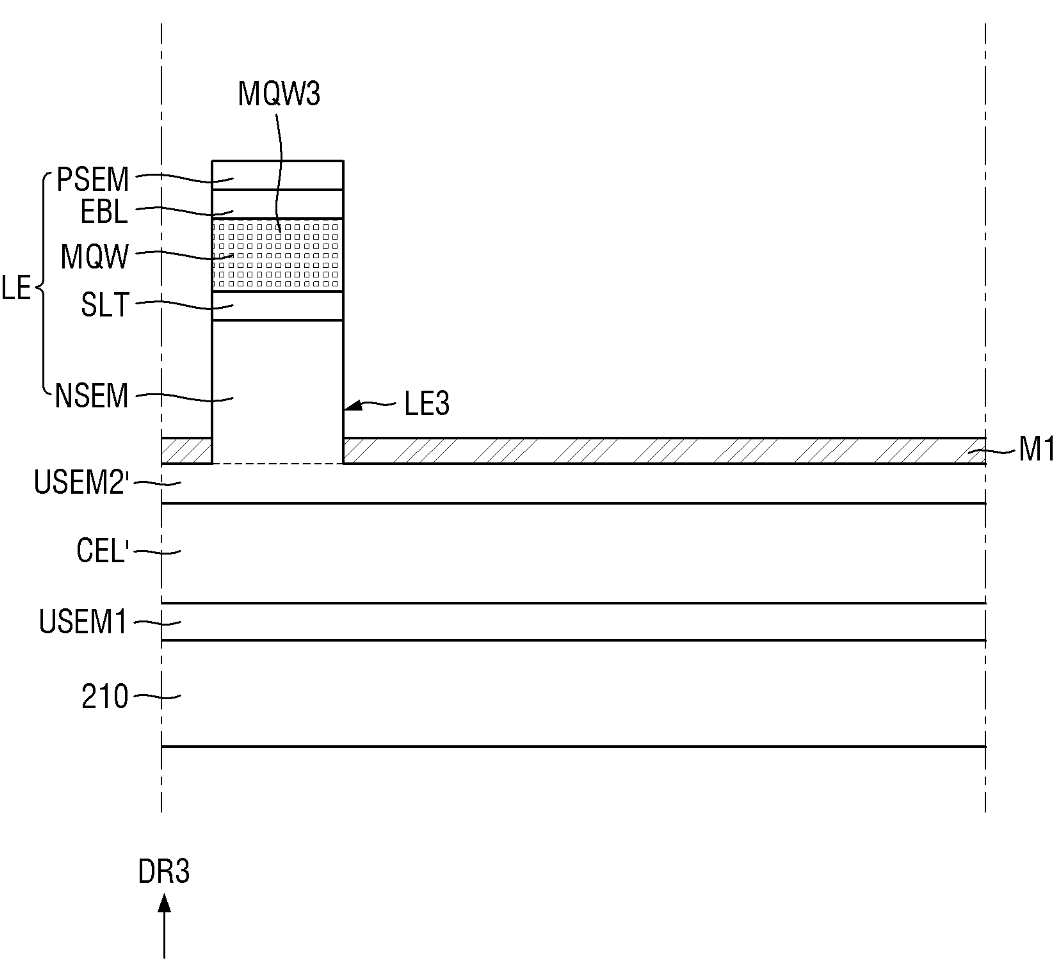

Referring to FIGS. 7 and 9, a first mask M1 may be formed in an area excluding the area in which a third light emitting element LE3 is to be formed, on the second undoped semiconductor layer USEM2', and the third light emitting element LE3 is formed (S40). In the flowchart of FIG. 7, the first, second, and third light emitting elements LE1, LE2, and LE3 according to FIGS. 8 to 16 have been described as the third light emitting element, the second light emitting element, and the first light emitting element, respectively, but this is only for clearly describing the order in the method for fabrication of the display device, and embodiments are not limited thereto.

Figure 10:
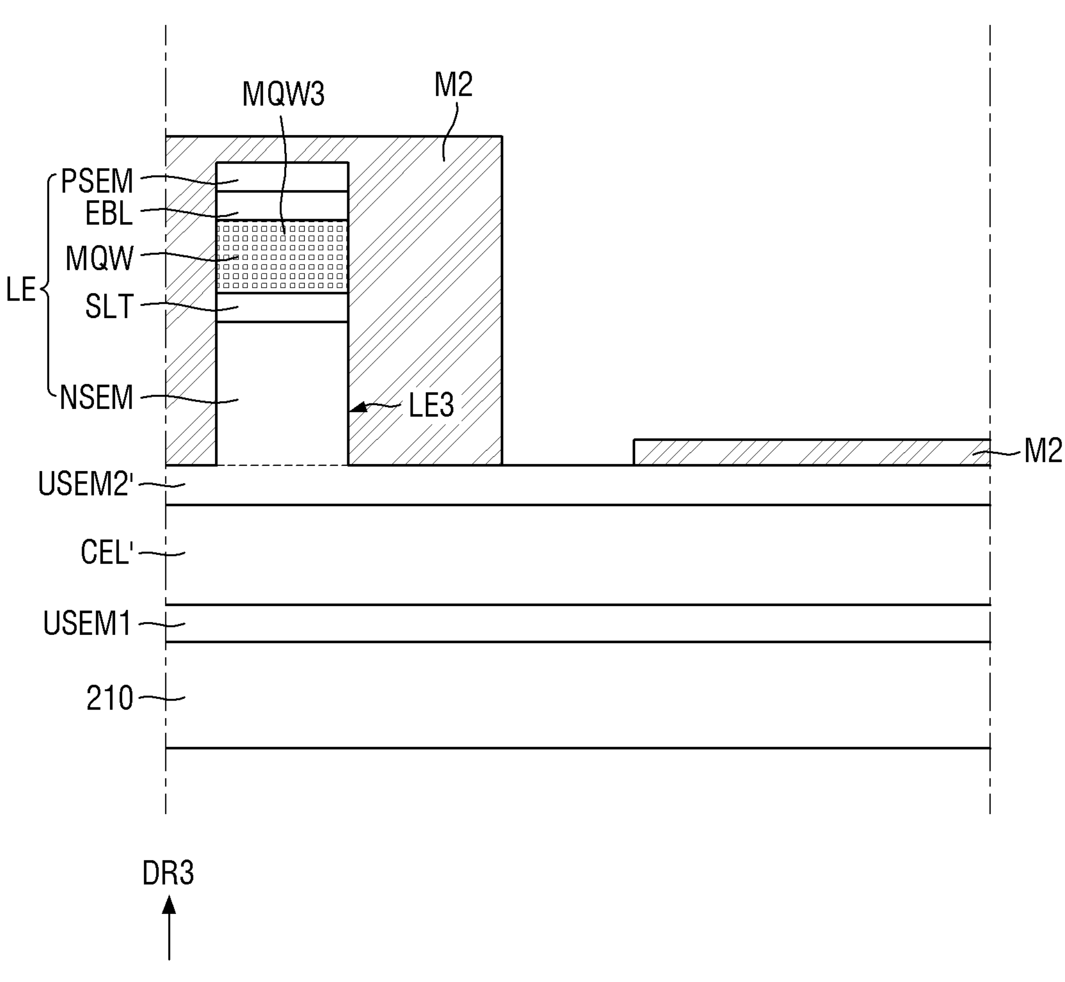
Figure 11:
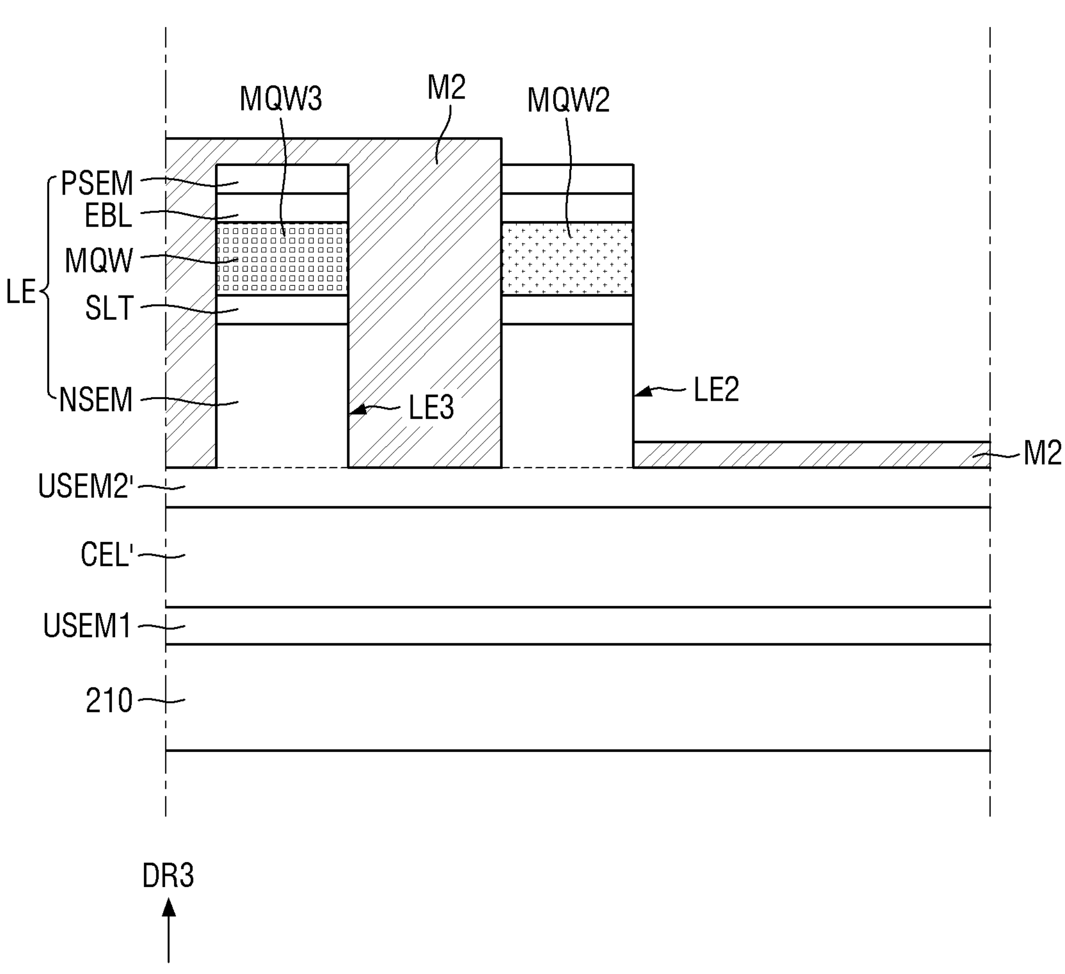

Referring to FIGS. 7, 10, and 11, the first mask M1 may be removed, a second mask M2 is formed in an area excluding an area in which a second light emitting element LE2 is to be formed, and the second light emitting element LE2 is formed (S50).

Figure 12:
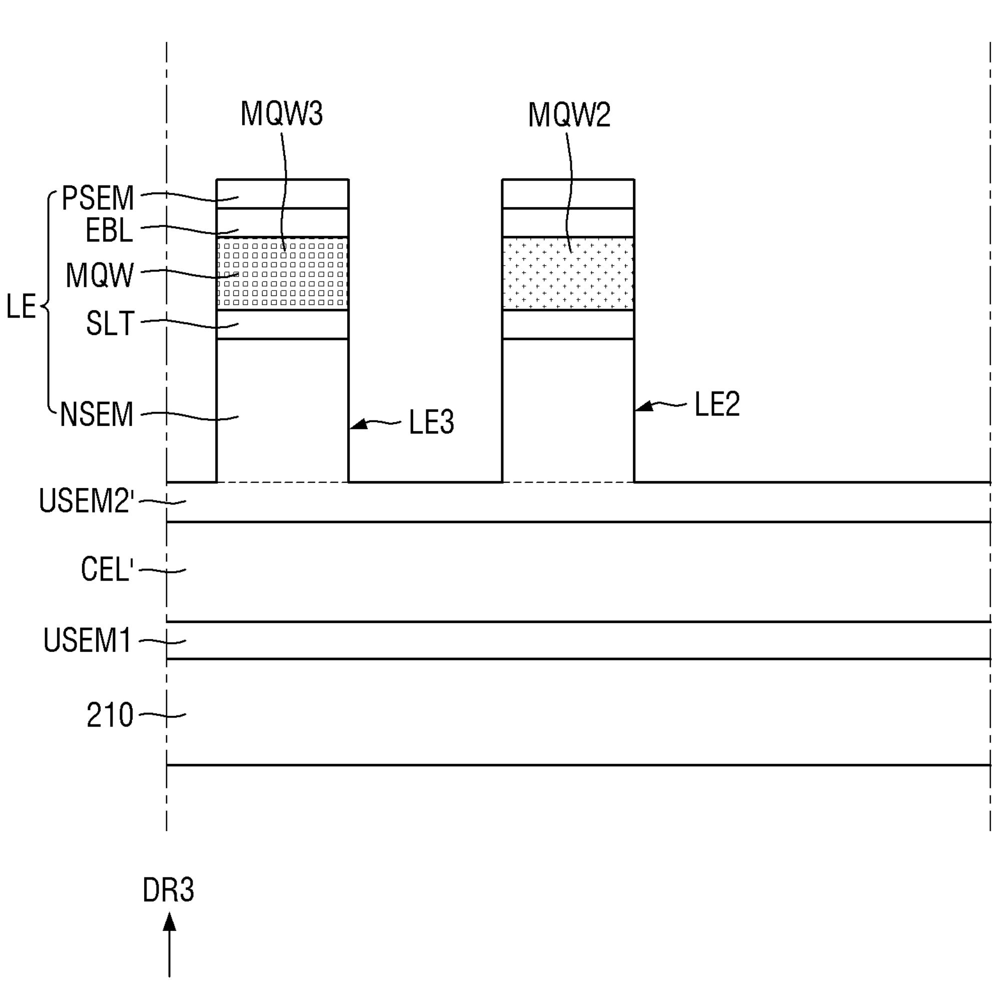

Referring to FIG. 12, the second mask M2 may be removed.

Figure 13:
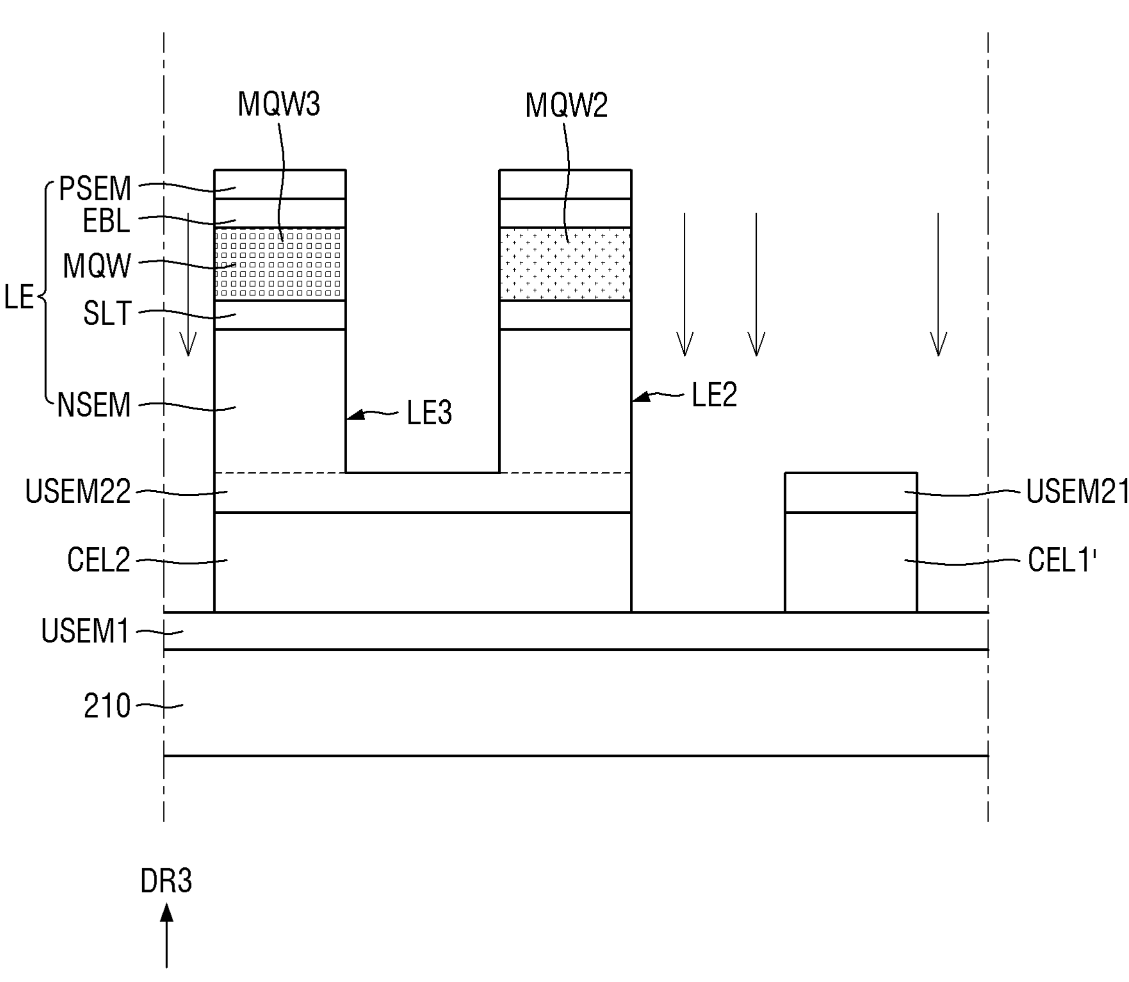

Referring to FIGS. 7 and 13, the second undoped semiconductor layer USEM2' (see FIG. 12) and the common electrode layer CEL' (see FIG. 12) may be selectively removed and remained in an area for forming a first light emitting element LE1 (see FIG. 15) and an area for forming the second light emitting element LE2. For example, a first common electrode part CEL1' may be formed in the area for forming the first light emitting element LE1, and a second common electrode part CEL2 may be formed on the first and second light emitting elements LE2 and LE3 (S60).

Through such a process, the second undoped semiconductor layer USEM2 (see FIG. 6) may include the second undoped semiconductor part USEM22 on the second and third light emitting elements LE2 and LE3 and the first undoped semiconductor part USEM21 on the first light emitting element LE1.

Furthermore, in a process of removing the second undoped semiconductor layer USEM2' (see FIG. 12) between the area for forming the first light emitting element LE1 (see FIG. 15) and the area for forming the second light emitting element LE2, the second undoped semiconductor layer USEM2' and the common electrode layer CEL' between the area for forming the first light emitting element LE1 and the area for forming the third light emitting element LE3 may be removed together.

Figure 14:
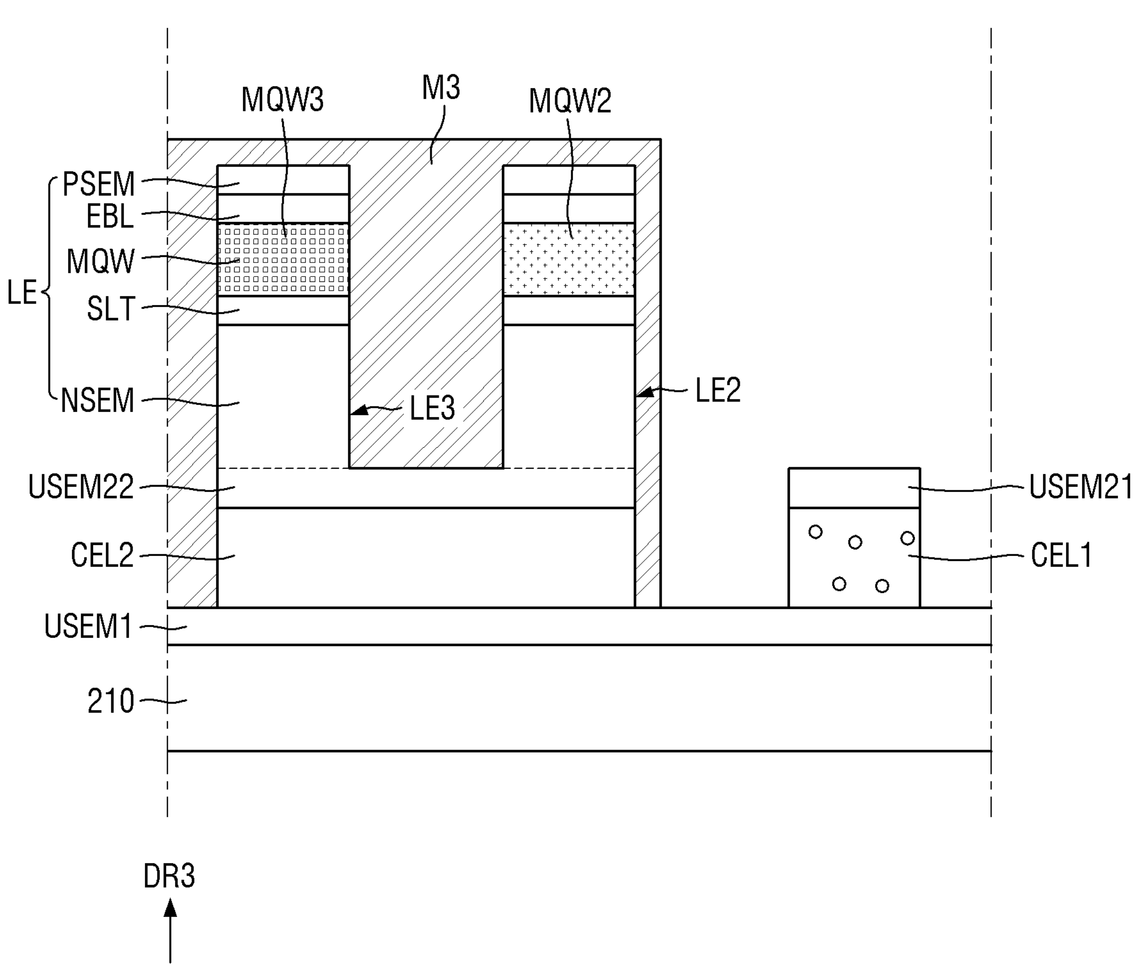

As illustrated in FIG. 14, a third mask M3 sealing the second and third light emitting elements LE2 and LE3 is formed, and the first common electrode part CEL1 is formed in the porous structure (S70).

According to an example, in order to perform an electro-chemical etching process, a potassium hydroxide (KOH) or nitric acid ($HNO_3$) solution may be used, but embodiments are not limited thereto.

According to an embodiment, the electro-chemical etching process may be selectively applied to the first common electrode part CEL1' before etching. The electro-chemical etching process may be selectively applied based on a concentration of a dopant provided to an individual semiconductor layer and an applied voltage. For example, in order to selectively apply the electro-chemical etching process to the first common electrode part CEL1' before the etching, a magnitude of a used voltage may be appropriately selected.

Figure 15:
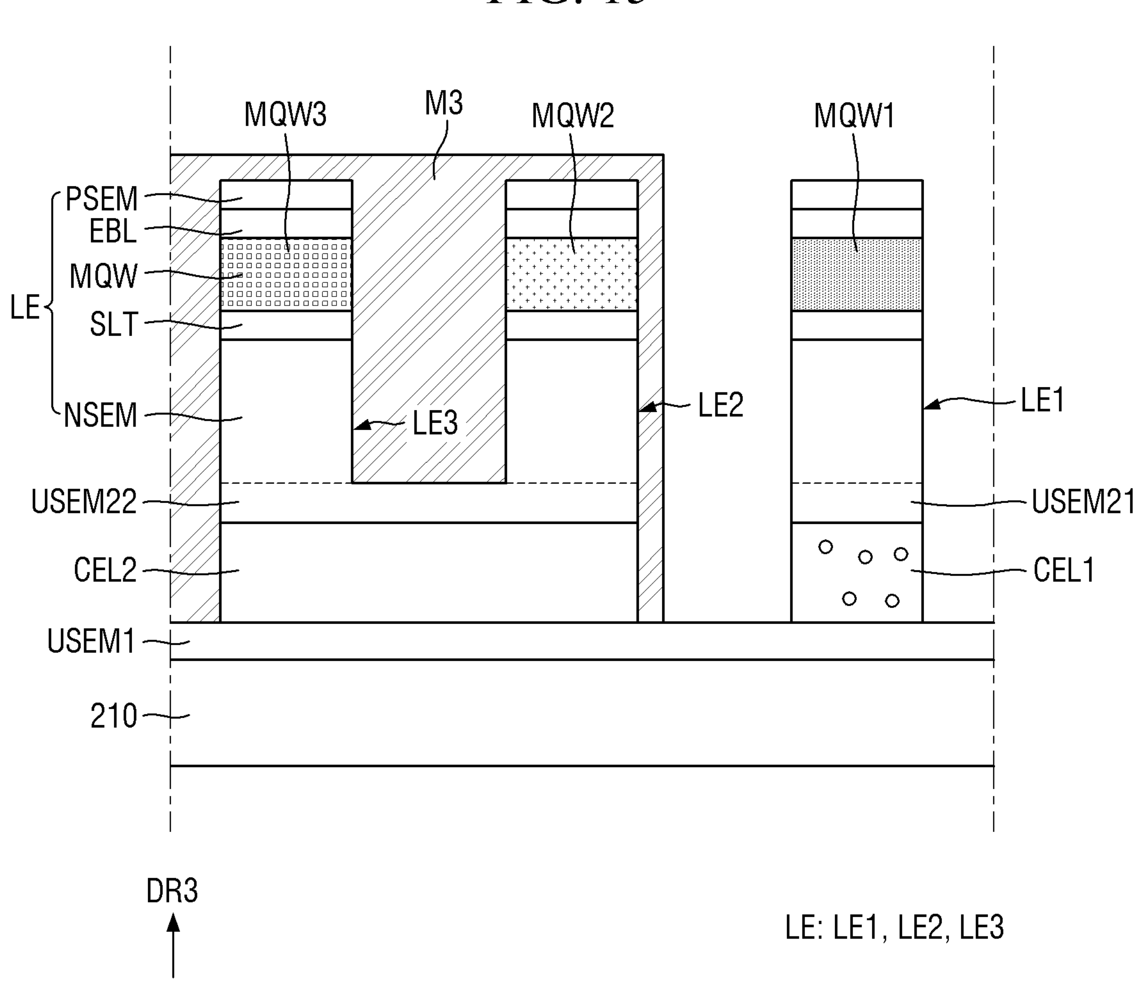

As illustrated in FIGS. 7 and 15, the first light emitting element LE1 is formed on the first undoped semiconductor part USEM21 (S80).

Figure 16:
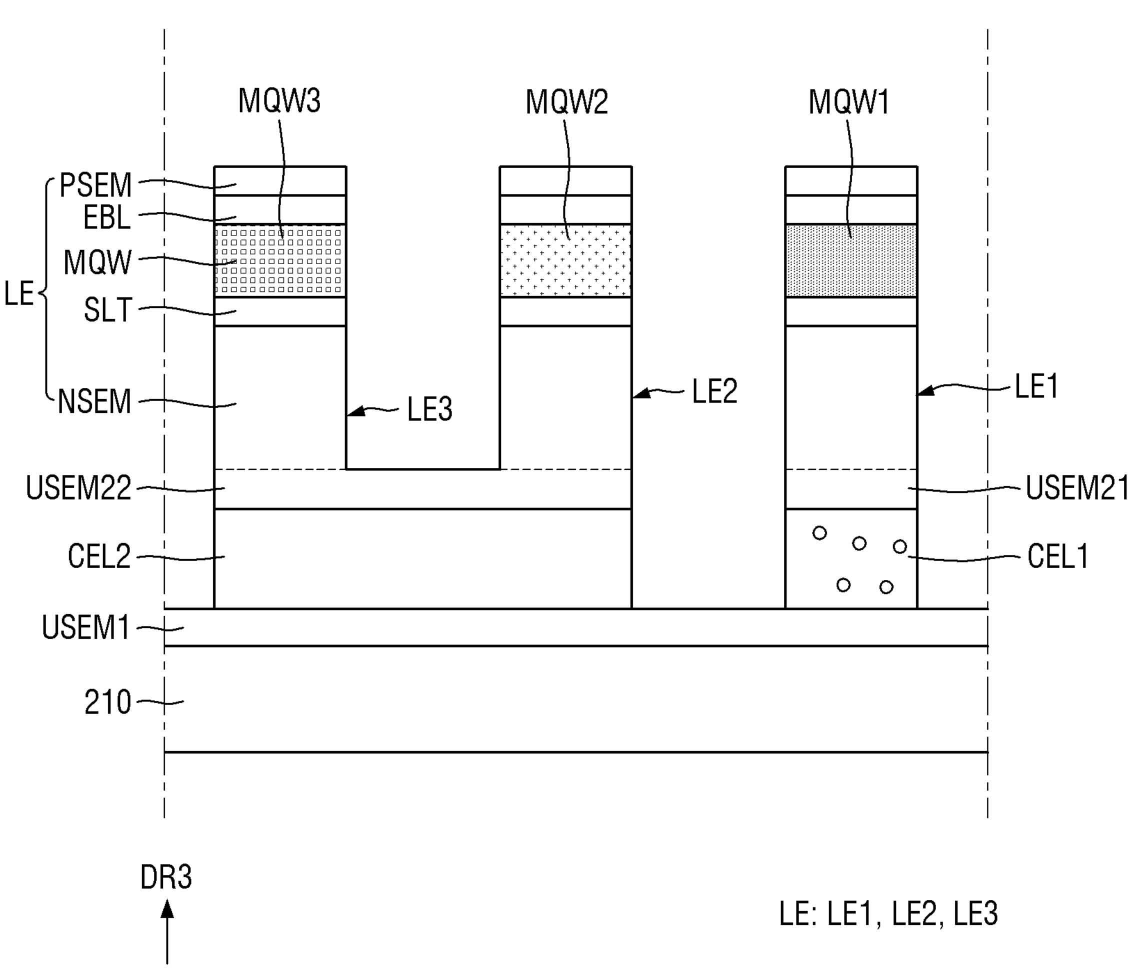

As illustrated in FIG. 16, the third mask M3 is removed.

Subsequently, for example, the first connection electrodes CNE1 may be formed on the light emitting elements LE. The first connection electrodes CNE1 may be formed on the light emitting elements LE1, LE2, and LE3 by a photolithography process.

The display substrate 200 disposed on the second substrate 210 may be fabricated by the processes described above. For example, the display device 1 may be fabricated by bonding the semiconductor circuit substrate 100 and the display substrate 200 to each other.

The semiconductor circuit substrate 100 may include the first substrate 110 including the pixel circuit units PXC and the pixel electrodes AE formed on at least one surface of the first substrate 110. The second substrate 210 and the display substrate 200 may be aligned on the semiconductor circuit substrate 100 so that the light emitting elements LE correspond to (e.g., overlap or face) the pixel electrodes AE of the semiconductor circuit substrate 100. The first connection electrodes CNE1 may be aligned to overlap (or to face) the pixel electrodes AE in the thickness direction (e.g., in the vertical direction).

In case that the second substrate 210 and the display substrate 200 are aligned with the semiconductor circuit substrate 100, the filling layer 500 may be disposed between the display substrate 200 and the semiconductor circuit substrate 100, and the display substrate 200 and the semiconductor circuit substrate 100 may be bonded to each other. As an example, a material of the filling layer 500 may be injected or sprayed so as to fill spaces between the display substrate 200 and the semiconductor circuit substrate 100 in case that the display substrate 200 and the semiconductor circuit substrate 100 are aligned with each other, such that the first connection electrodes CNE1 may be in contact with the pixel electrodes AE. Thereafter, in case that the injected material of the filling layer 500 is cured, the display substrate 200 and the semiconductor circuit substrate 100 may be bonded to each other. However, embodiments are not limited thereto.

The first connection electrodes CNE1 disposed on the light emitting elements LE of the display substrate 200 may be in direct contact with the pixel electrodes AE. In case that the semiconductor circuit substrate 100 and the display substrate 200 are bonded to each other, both ends (e.g., opposite ends) of the light emitting elements LE may be electrically connected to the pixel circuit units PXC of the semiconductor circuit substrate 100.

For example, the display device 1 may be fabricated by removing the second substrate 210 disposed on the undoped semiconductor layer USEM of the display substrate 200.

Hereinafter, a display device according to another embodiment will be described.

Figure 17:
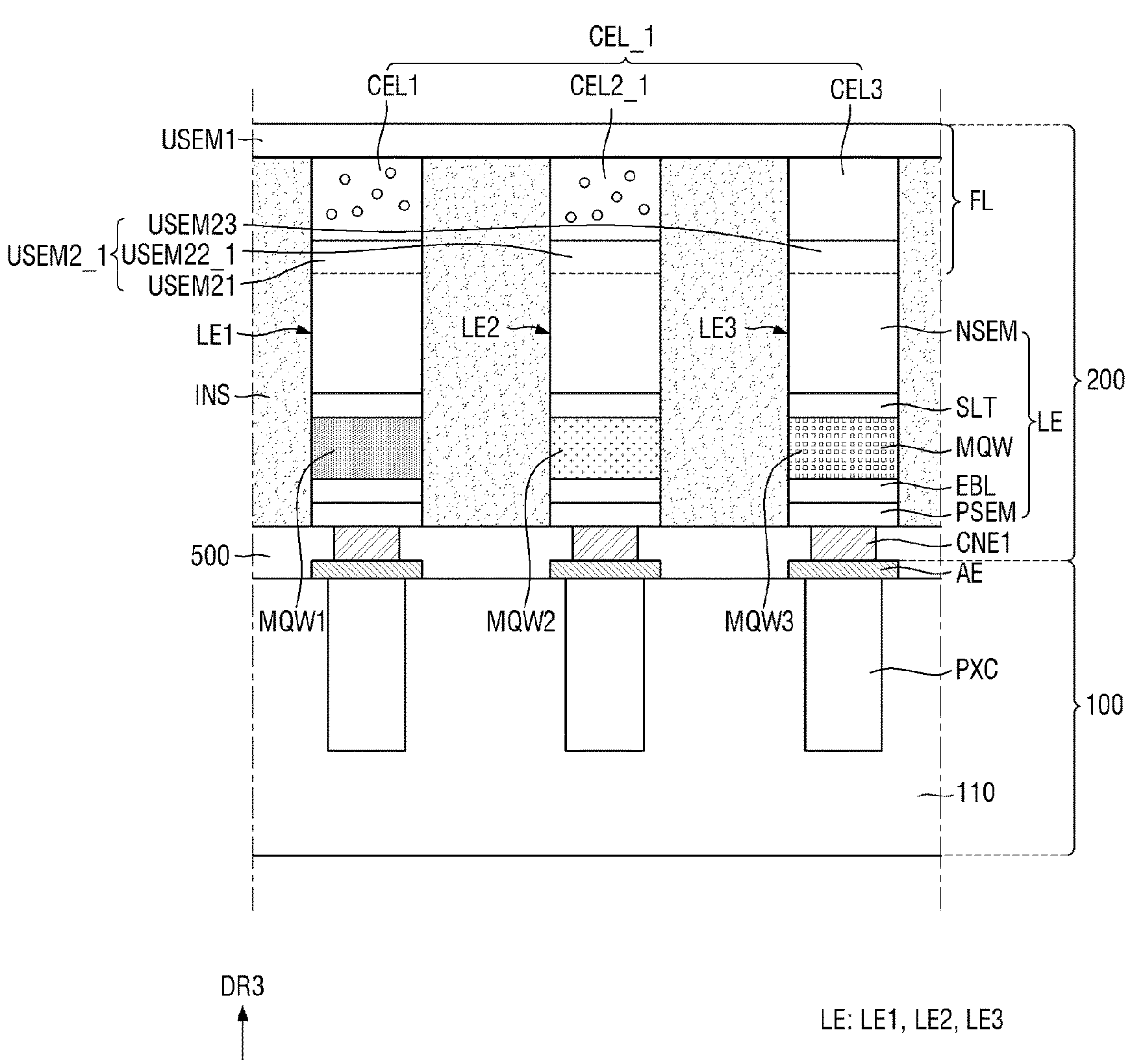
FIG. 17 is a schematic cross-sectional view of a display device according to another embodiment.

FIG. 17 is a schematic cross-sectional view of a display device according to another embodiment.

Referring to FIG. 17, a display device according to an embodiment is different from the display device illustrated in FIG. 6 in that a common electrode layer CEL1_1 includes a first common electrode part CEL1 on the first light emitting element LE1, a second common electrode part CEL2_1 on the second light emitting element LE2, and a third common electrode part CEL3 on the third light emitting element LE3.

The first common electrode part CEL1, the second common electrode part CEL2_1, and the third common electrode part CEL3 may be separated from each other. For example, the first common electrode part CEL1, the second common electrode part CEL2_1, and the third common electrode part CEL3 may be spaced apart from each other, e.g., in a horizontal direction. Each of the first common electrode part CEL1 and the second common electrode part CEL2_1 may include a porous semiconductor layer, which may include porous gallium nitride (GaN). Accordingly, a porous density of each of the first common electrode part CEL1 and the second common electrode part CEL2_1 may be greater than a porous density of the third common electrode part CEL3. As described above with reference to FIG. 6, since the contents of indium (In) decrease in the order of the first active layer MQW1, the second active layer MQW2, and the third active layer MQW3, the lattice constant of the first active layer MQW1 may be the greatest value, the lattice constant of the second active layer MQW2 may be the medium value, and the lattice constant of the third active layer MQW3 may be the smallest value. Accordingly, a possibility an internal defect will occur may be the highest in the first active layer MQW1, and may be the second highest in the second active layer MQW2. According to an embodiment, the possibility of the occurrence of the internal defect in the second active layer MQW2 may be decreased.

In some embodiments, the porous density of the first common electrode part CEL1 may be the same as the porous density of the second common electrode part CEL2_1.

In some embodiments, the porous density of the second common electrode part CEL2_1 may be smaller than the porous density of the first common electrode part CEL1. This may be possible because magnitudes (or amplitudes) of used voltages are different from each other in order to selectively apply the electro-chemical etching process to the first common electrode part CEL1' and the second common electrode part before etching, as described above. For example, a magnitude of a voltage applied to the first common electrode part CEL1' before the etching may be greater than a magnitude of a voltage applied to the second common electrode part before the etching.

Figure 18:
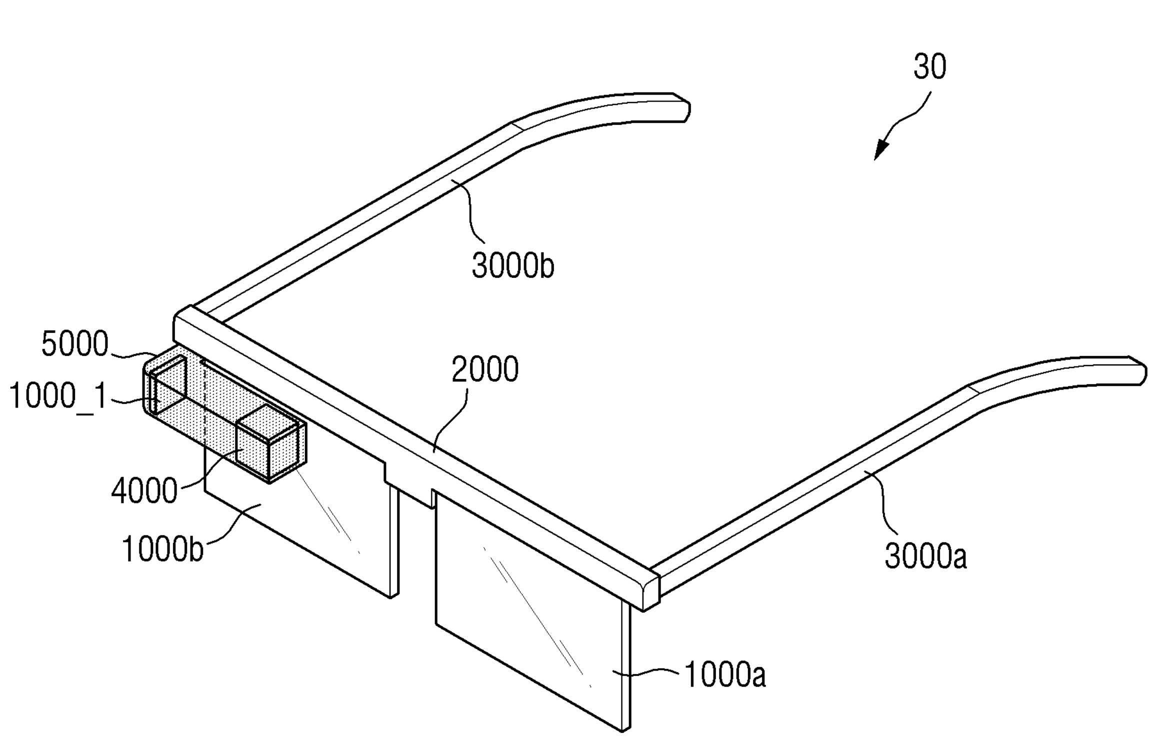
FIG. 18 is an illustrative view illustrating a virtual reality device including the display device according to an embodiment.

FIG. 18 is an illustrative view illustrating a virtual reality device including the display device according to an embodiment. A virtual reality device 30 to which a display device 1000-1 according to an embodiment is applied is illustrated in FIG. 18.

Referring to FIG. 18, the virtual reality device 30 according to an embodiment may be a glasses-type device. The virtual reality device 30 according to an embodiment may include the display device 1000-1, a left eye lens 1000*a*, a right eye lens 1000*b*, a support frame 2000, eyeglass frames legs 3000*a* and 3000*b*, a reflective member 4000, and a display device accommodating part 5000.

The virtual reality device 30 including the eyeglass frame legs 3000*a* and 3000*b* has been illustrated in FIG. 18, but the virtual reality device 30 according to an embodiment may also be applied to a head mounted display including a head mounted band that may be mounted on a user's head instead of the eyeglass frame legs 3000*a* and 3000*b*. For example, the virtual reality device 30 according to an embodiment is not limited to that illustrated in FIG. 27, and may be applied in various forms to various other electronic devices.

The display device accommodating part 5000 may include the display device 1000_1 and the reflective member 4000. An image displayed on the display device 1000_1 may be reflected by the reflective member 4000 and provided to a user's right eye through the right eye lens 1000*b*. Accordingly, a user may view a virtual reality image displayed on the display device 1000_1 through right eye of the user.

It has been illustrated in FIG. 18 that the display device accommodating part 5000 is disposed at a right distal end of the support frame 2000, but embodiments are not limited thereto. For example, the display device accommodating part 5000 may be disposed at a left distal end of the support frame 2000. For example, an image displayed on the display device 1000_1 may be reflected by the reflective member 4000 and provided to a user's left eye through the left eye lens 1000*a*. Accordingly, the user may view a virtual reality image displayed on the display device 1000_1 through left eye of the user. In other embodiments, the display device accommodating parts 5000 may be disposed at both the left and right distal ends of the support frame 2000. For example, the user may view a virtual reality image displayed on the display device 1000_1 through both left and right eyes of the user.

Figure 19:
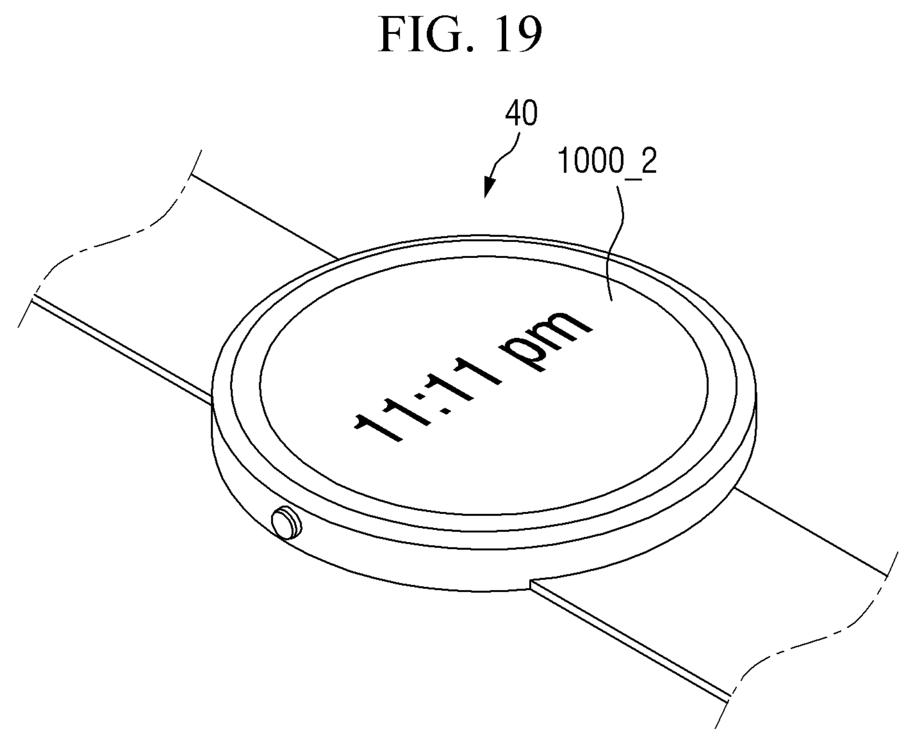
FIG. 19 is an illustrative view illustrating a smart device including the display device according to an embodiment.

FIG. 19 is an illustrative view illustrating a smart device including the display device according to an embodiment.

Referring to FIG. 19, a display device 1000_2 according to an embodiment may be applied to a smart watch 40, which is one of the smart devices.

Figure 20:
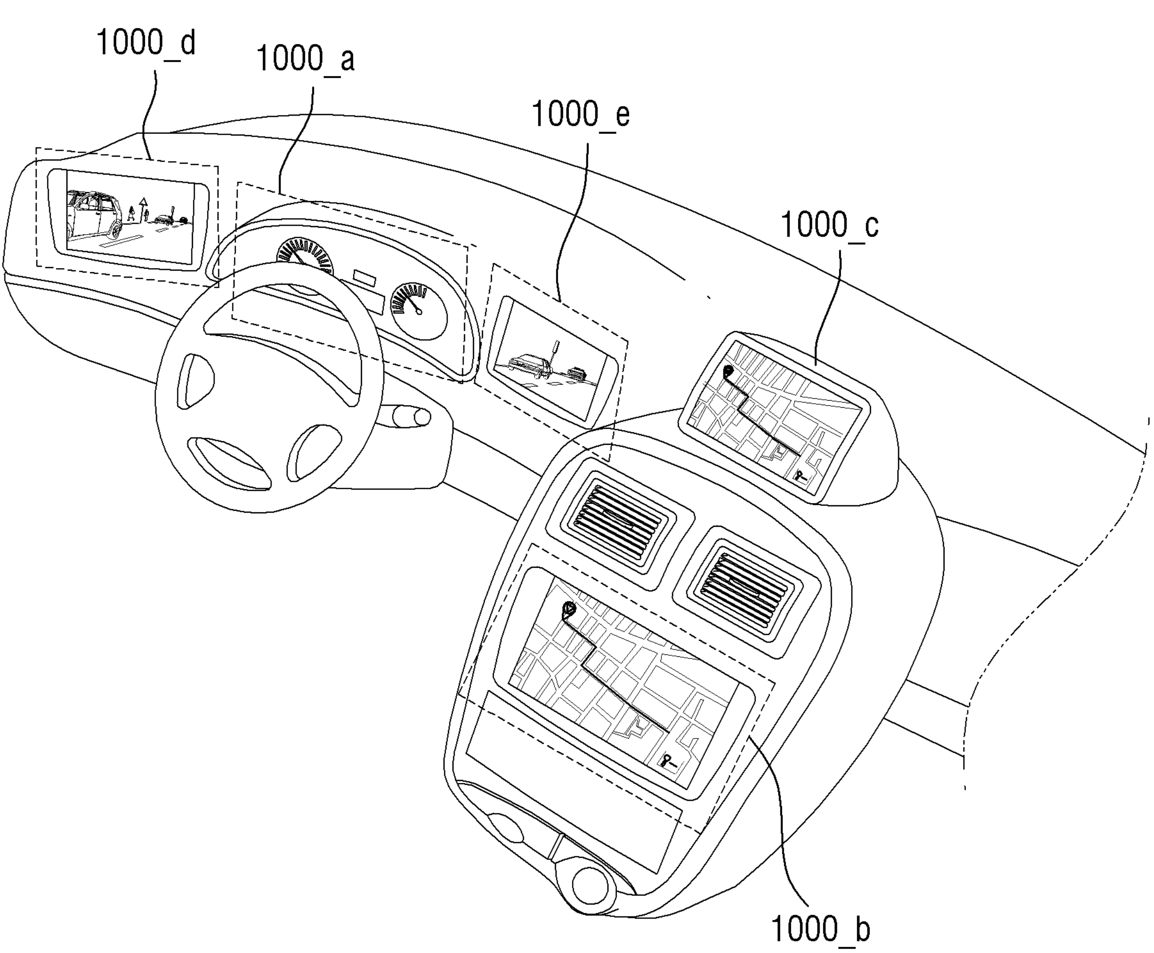
FIG. 20 is an illustrative view illustrating an instrument board and a center fascia of a vehicle including the display device according to an embodiment.

FIG. 20 is an illustrative view illustrating an instrument board and a center fascia of a vehicle including the display device according to an embodiment. A vehicle to which display devices 1000_*a*, 1000_*b*, 1000_*c*, 1000_*d*, and 1000_*e* according to an embodiment are applied is illustrated in FIG. 20.

Referring to FIG. 20, the display devices 1000_*a*, 1000_*b*, and 1000_*c* according to an embodiment may be applied to an instrument board of the vehicle, applied to a center fascia of the vehicle, or applied to a center information display (CID) disposed on a dashboard of the vehicle. For example, the display device 1000_*d* and 1000_*e* according to an embodiment may be applied to a room mirror display substituting for a side mirror of the vehicle.

Figure 21:
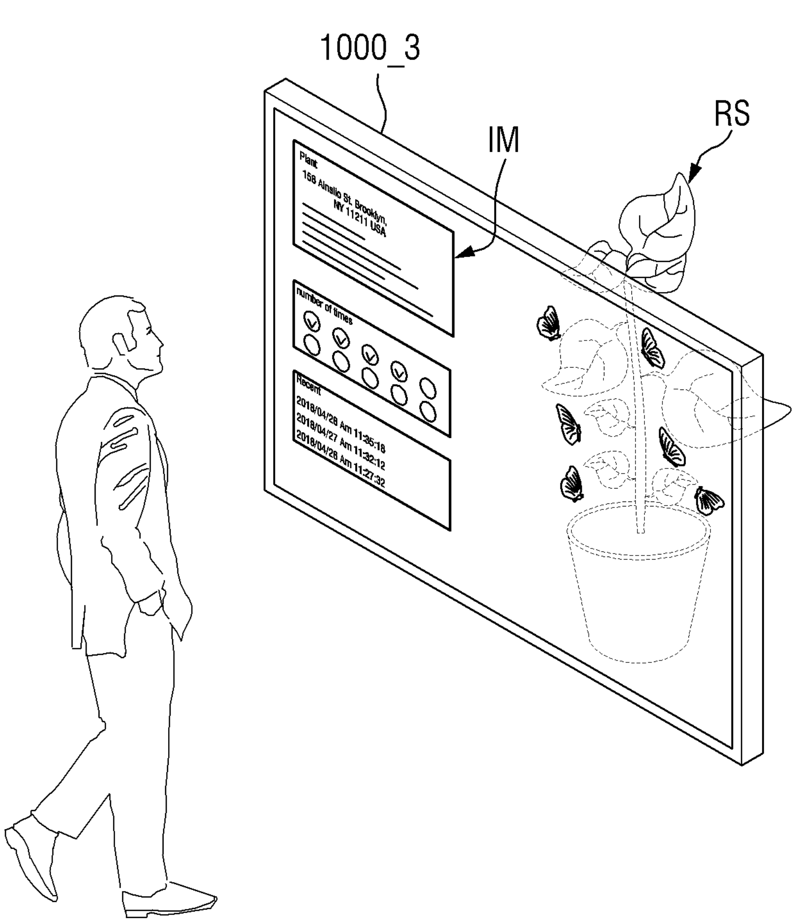
FIG. 21 is an illustrative view illustrating a transparent display device including the display device according to an embodiment.

FIG. 21 is an illustrative view illustrating a transparent display device including the display device according to an embodiment.

Referring to FIG. 21, a display device 1000_3 according to an embodiment may be applied to a transparent display device. The transparent display device may transmit light while displaying an image IM. Therefore, a user positioned on a front surface of the transparent display device may not only view the image IM displayed on the display device 1000_3, but also see an object RS or a background positioned on a rear surface of the transparent display device. In case that the display device 1000_3 is applied to the transparent display device, a first substrate 110 (see FIG. 5) of the display device 1000_3 may include a light transmitting part capable of transmitting light or may be made of a material capable of transmitting light.

Although embodiments of the disclosure have been disclosed for illustrative purposes, those skilled in the art will appreciate that various modifications, additions and substitutions are possible, without departing from the scope and spirit of the disclosure as disclosed in the accompanying claims and their equivalents.

What is claimed is:

1. A display device comprising:
a plurality of pixel electrodes spaced apart from each other on a substrate;
a plurality of light emitting elements disposed on the plurality of pixel electrodes;
a first undoped semiconductor layer on the plurality of light emitting elements;
a second undoped semiconductor layer between the first undoped semiconductor layer and the plurality of light emitting elements; and
a common electrode layer between the first undoped semiconductor layer and the second undoped semiconductor layer,
wherein the common electrode layer includes at least two parts which are separated from each other,
wherein the plurality of light emitting elements include:
a first light emitting element;
a second light emitting element; and
a third light emitting element,
wherein the common electrode layer includes:
a first common electrode part on the first light emitting element; and
a second common electrode part on the second light emitting element and the third light emitting element, and
wherein the first common electrode part and the second common electrode part are spaced apart from each other, and
wherein the second common electrode part on the second light emitting element and the second common electrode part on the third light emitting element are integral with each other.

2. The display device of claim 1, wherein
the second undoped semiconductor layer includes:
a first undoped semiconductor part on the first light emitting element; and
a second undoped semiconductor part on the second light emitting element and the third light emitting element, and
the first undoped semiconductor part and the second undoped semiconductor part are spaced apart from each other.

3. The display device of claim 2, wherein the second undoped semiconductor part on the second light emitting element and the second undoped semiconductor part on the third light emitting element are integral with each other.

4. The display device of claim 3, wherein the first undoped semiconductor layer on the first light emitting element, the second light emitting element, and the third light emitting element are integral with each other.

5. The display device of claim 1, wherein the first common electrode part includes a porous semiconductor layer.

6. The display device of claim 5, wherein the porous semiconductor layer includes porous gallium nitride (GaN).

7. The display device of claim 5, wherein a porous density of the first common electrode part is greater than a porous density of the second common electrode part.

8. A method for fabrication of the display device of claim 1, the method comprising:
forming the first undoped semiconductor layer on the substrate;

forming the common electrode layer including an n-type semiconductor on the first undoped semiconductor layer;

forming the second undoped semiconductor layer on the common electrode layer;

forming a first light emitting element of the plurality of light emitting elements on the second undoped semiconductor layer;

forming a second light emitting element of the plurality of light emitting elements on the second undoped semiconductor layer;

forming a first common electrode part of the common electrode layer in an area for forming a third light emitting element of the plurality of light emitting elements and a second common electrode part of the common electrode layer on the first and second light emitting elements by selectively removing the second undoped semiconductor layer and the common electrode layer;

forming the first common electrode part in a porous structure; and forming the third light emitting element on the second undoped semiconductor layer.

9. The method of claim 8, wherein the forming of the first common electrode part in the porous structure is performed by an electro-chemical (EC) etching process.

10. The method of claim 8, wherein the first common electrode part includes a porous semiconductor layer, and the porous semiconductor layer includes porous gallium nitride (GaN).

11. The method of claim 10, wherein a porous density of the first common electrode part is greater than a porous density of the second common electrode part.

12. The method of claim 8, wherein the first light emitting element includes a blue light emitting element, the second light emitting element includes a green light emitting element, and the third light emitting element includes a red light emitting element.

* * * * *